(12) United States Patent
Toyoda et al.

(10) Patent No.: US 7,612,378 B2
(45) Date of Patent: Nov. 3, 2009

(54) SEMICONDUCTOR DEVICE WITH MULTIPLE IMPURITY REGIONS AND IMAGE DISPLAY APPARATUS

(75) Inventors: Yoshihiko Toyoda, Chiyoda-ku (JP); Naoki Nakagawa, Chiyoda-ku (JP); Taro Yoshino, Chiyoda-ku (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 17 days.

(21) Appl. No.: 11/376,414

(22) Filed: Mar. 16, 2006

(65) Prior Publication Data
US 2006/0214229 A1 Sep. 28, 2006

(30) Foreign Application Priority Data
Mar. 24, 2005 (JP) ............................. 2005-086674

(51) Int. Cl.
*H01L 29/08* (2006.01)
(52) U.S. Cl. ................................. 257/72; 257/E29.278
(58) Field of Classification Search ................... 257/72, 257/E29.277, E29.278
See application file for complete search history.

(56) References Cited

U.S. PATENT DOCUMENTS

| 5,196,357 | A | 3/1993 | Boardman et al. | |
|---|---|---|---|---|
| 5,227,320 | A | 7/1993 | Johnson et al. | |
| 5,340,761 | A | 8/1994 | Loh et al. | |
| 5,358,879 | A | 10/1994 | Brady et al. | |
| 6,410,373 | B1 | 6/2002 | Chang et al. | |
| 6,501,098 | B2 * | 12/2002 | Yamazaki | ............... 257/72 |
| 6,628,349 | B1 | 9/2003 | Takei et al. | |
| 6,646,287 | B1 * | 11/2003 | Ono et al. | ............... 257/66 |
| 7,176,491 | B2 * | 2/2007 | Toyoda et al. | ............... 257/59 |
| 2001/0011725 | A1 * | 8/2001 | Sakama et al. | ............... 257/59 |
| 2002/0074548 | A1 * | 6/2002 | Lee et al. | ............... 257/59 |
| 2002/0079496 | A1 | 6/2002 | Deane et al. | |
| 2003/0209737 | A1 | 11/2003 | Mitani et al. | |
| 2005/0236618 | A1 | 10/2005 | Toyoda et al. | ............... 257/52 |
| 2005/0253195 | A1 | 11/2005 | Toyoda et al. | ............... 257/347 |
| 2005/0263770 | A1 | 12/2005 | Sugahara et al. | ............... 257/72 |

FOREIGN PATENT DOCUMENTS

| JP | 2000-223711 | 8/2000 |
|---|---|---|
| JP | 2001-345448 | 12/2001 |
| JP | 2002-76351 | 3/2002 |
| JP | 2002-289865 | 10/2002 |
| TW | 480735 B | 3/2002 |

(Continued)

*Primary Examiner*—Minh-Loan T Tran
*Assistant Examiner*—W. Wendy Kuo
(74) *Attorney, Agent, or Firm*—Oblon, Spivak, McClelland, Maier & Neustadt, L.L.P.

(57) ABSTRACT

A silicon nitride film and a silicon oxide film are formed on a glass substrate. On the silicon oxide film is formed a thin film transistor including a source region, a drain region, a channel region having a predetermined channel length, an LDD region and GOLD region having an impurity concentration higher than the impurity concentration of the channel region and lower than the impurity concentration of the source and drain regions, a gate insulation film, and a gate electrode. The gate electrode is formed to overlap in plane with the channel region and the GOLD region. Accordingly, a semiconductor device and an image display apparatus directed to improving source-drain breakdown voltage are obtained.

30 Claims, 29 Drawing Sheets

FOREIGN PATENT DOCUMENTS

| | | |
|---|---|---|
| TW | 512530 B | 12/2002 |
| TW | 522571 B | 3/2003 |
| TW | 538529 B | 6/2003 |
| TW | 224398 B | 11/2004 |
| TW | 226962 B | 1/2005 |

* cited by examiner

FIG.11
| COMPARISON OF SOURCE-DRAIN BREAKDOWN VOLTAGE OF THIN FILM TRANSISTOR | |
|---|---|
| | BREAKDOWN VOLTAGE |
| THIN FILM TRANSISTOR OF PRESENT EMBODIMENT | 26.8V |
| THIN FILM TRANSISTOR WITH LDD REGIONS AT BOTH SIDES | 27.3V |
| THIN FILM TRANSISTOR OF CONVENTIONAL LDD STRUCTURE | 12.7V |
FIG.12
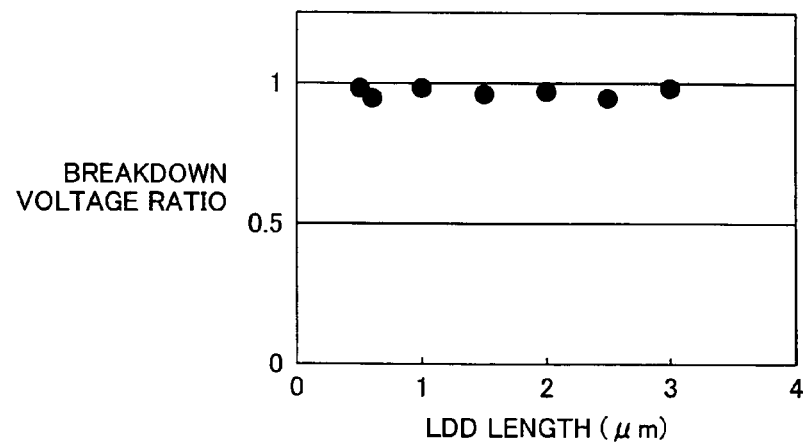
FIG.13
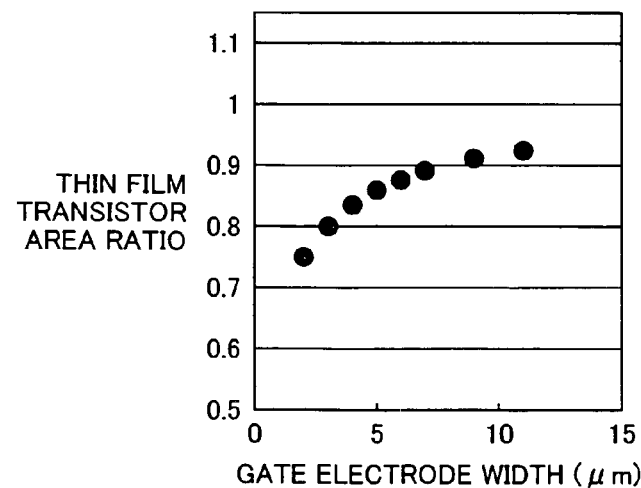

FIG.26
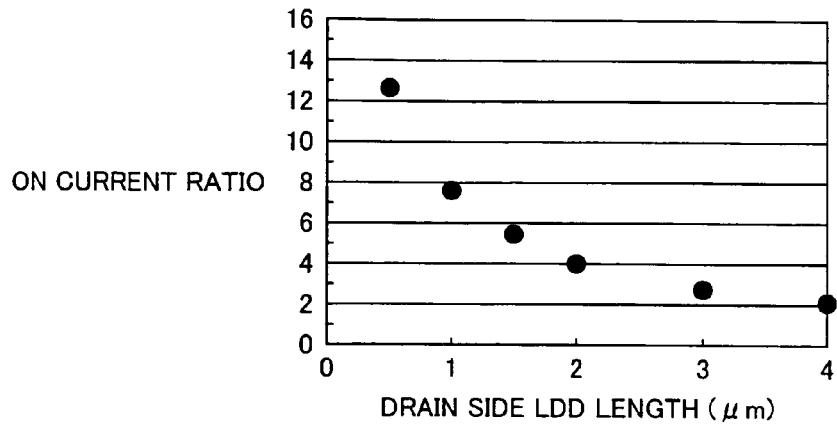
FIG.27
| COMPARISON OF SOURCE-DRAIN BREAKDOWN VOLTAGE OF THIN FILM TRANSISTOR | |
|---|---|
| | BREAKDOWN VOLTAGE |
| THIN FILM TRANSISTOR OF PRESENT EMBODIMENT | 25.3V |
| THIN FILM TRANSISTOR WITH LDD REGIONS AT BOTH SIDES | 25.4V |
| THIN FILM TRANSISTOR OF CONVENTIONAL LDD STRUCTURE | 12.7V |
FIG.28
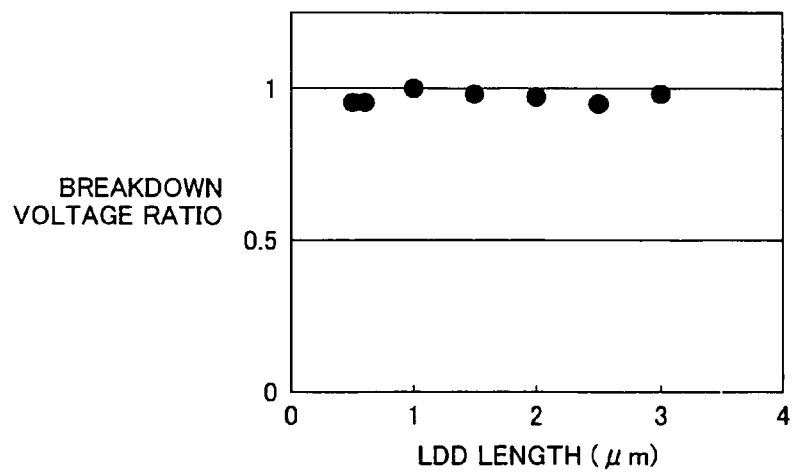

FIG.37
| COMPARISON OF SOURCE-DRAIN BREAKDOWN VOLTAGE OF THIN FILM TRANSISTOR | |
|---|---|
| | BREAKDOWN VOLTAGE |
| THIN FILM TRANSISTOR OF PRESENT EMBODIMENT | 25.4V |
| THIN FILM TRANSISTOR WITH LDD AND GOLD REGIONS AT BOTH SIDES | 27.3V |
| THIN FILM TRANSISTOR OF CONVENTIONAL LDD STRUCTURE | 12.7V |
FIG.38
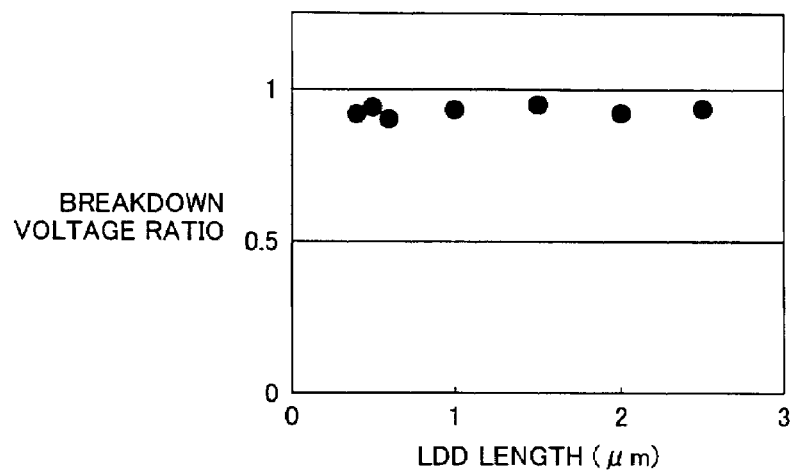
FIG.39
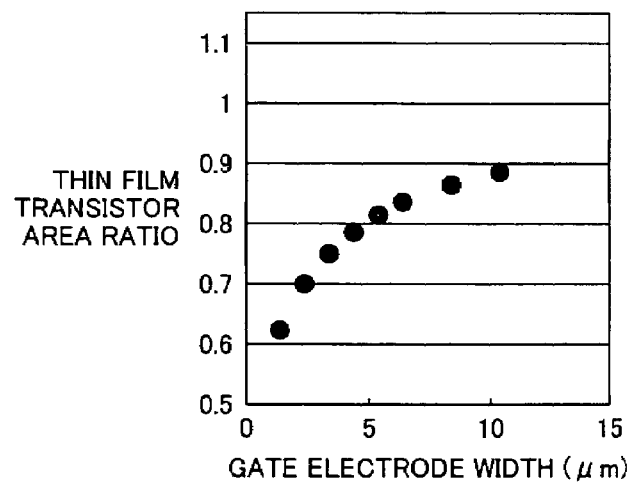

FIG.48
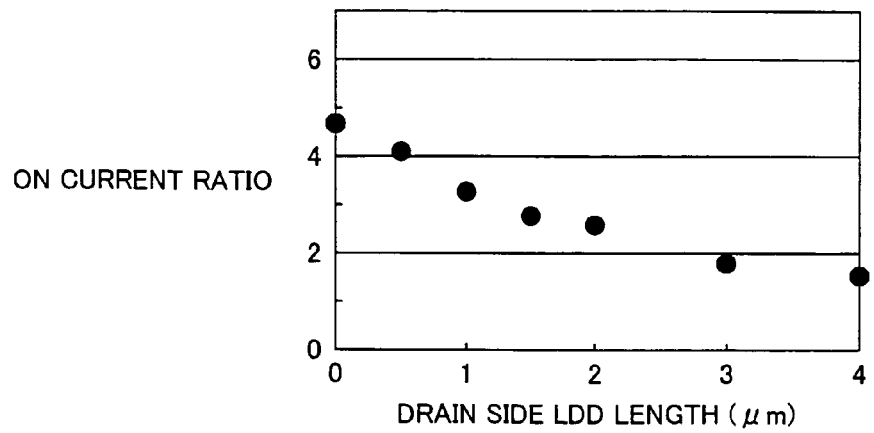
FIG.49
| COMPARISON OF SOURCE-DRAIN BREAKDOWN VOLTAGE OF THIN FILM TRANSISTOR | |
|---|---|
| | BREAKDOWN VOLTAGE |
| THIN FILM TRANSISTOR OF PRESENT EMBODIMENT | 26.9V |
| THIN FILM TRANSISTOR WITH LDD REGIONS AT BOTH SIDES | 27.3V |
| THIN FILM TRANSISTOR OF CONVENTIONAL LDD STRUCTURE | 12.7V |
FIG.50
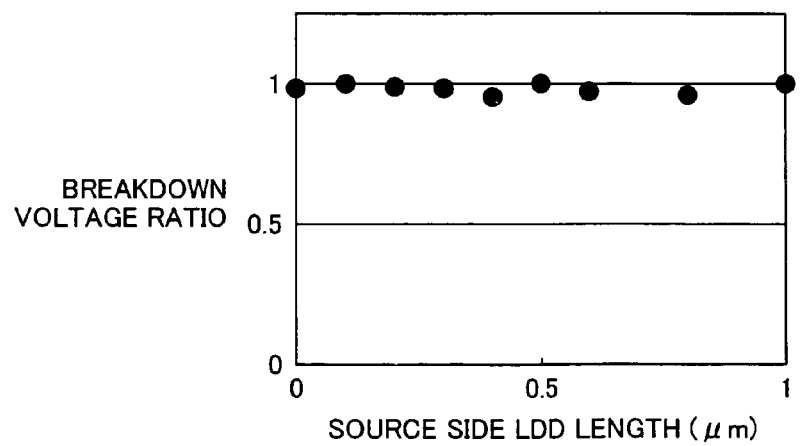

1 FRAME

SEMICONDUCTOR DEVICE WITH MULTIPLE IMPURITY REGIONS AND IMAGE DISPLAY APPARATUS

BACKGROUND OF THE INVENTION

1. Field of the Invention

The present invention relates to a semiconductor device and an image display apparatus. More particularly, the present invention relates to a semiconductor device applied to display devices such as a liquid crystal display device and organic EL (Electro Luminance) display device, and an image display apparatus employing such a semiconductor device.

2. Description of the Background Art

A thin film transistor is used in a display device. As an example thereof, a thin film transistor of a GOLD (Gate Overlapped Lightly Doped Drain) structure disclosed in Document 1 (Japanese Patent Laying-Open No. 2002-076351) will be described hereinafter. An n channel type thin film transistor of a GOLD structure has a source region, a drain region, a channel region, a GOLD region, a gate insulation film, a gate electrode, and the like, formed on a glass substrate.

The GOLD region is formed at a region between the channel region and the drain region, particularly at a region located right under the gate electrode. The GOLD region is formed overlapping with the gate electrode in plane. The GOLD region is set to have a higher impurity concentration than the channel region and a lower impurity concentration than the drain region.

The operation of an n channel type thin film transistor, for example, of the GOLD structure will be described here. A channel is formed at the channel region when a predetermined positive voltage is applied to the gate, whereby the resistance across the source region and the drain region is reduced to allow a current flow across the source region and the drain region. When a negative voltage is applied to the gate, the resistance across the source region and the drain region is increased since a channel is not formed at the channel region. Therefore, no current substantially flows across the source region and the drain region. Only a small leakage current will flow.

This leakage current is caused by the recoupling at the junction between holes formed at the channel and many electrons located at the source and drain regions. Since the probability of recoupling is increased when the electric field at the junction becomes higher, leakage current will be increased.

In a display device, the voltage applied to the liquid crystal must be maintained for the duration of one frame until the screen is rewritten. If leakage current at the pixel thin film transistor employed for retaining the voltage is great, the voltage applied to the liquid crystal will be decreased over time to degrade the display property. It is therefore necessary to minimize the leakage current in a pixel thin film transistor.

A thin film transistor of an LDD (Lightly Doped Drain) structure disclosed in Document 2 (Japanese Patent Laying-Open No. 2001-345448) will be described hereinafter as another example of a thin film transistor employed in a display device. An n channel type thin film transistor of the LDD structure has a source region, a drain region, a channel region, an LDD region, a gate insulation film, a gate electrode, and the like, formed on a glass substrate. The LDD region is formed at a region between the channel region and the drain region. The LDD region is set to have a higher impurity concentration than the channel region and a lower impurity concentration than the drain region.

In a thin film transistor of an LDD structure, application of a negative voltage as the gate voltage will cause an accumulation layer to be formed at the channel region. The electric field in the proximity of the source and drain is alleviated by the LDD region to allow the leakage current to be suppressed.

Conventional thin film transistors have problems set forth below. As mentioned above, a thin film transistor employed as a pixel thin transistor must have the leakage current suppressed to an extremely low level. In a thin film transistor of a GOLD structure that is one example of a conventional thin film transistor, application of a negative voltage as the gate voltage will result in formation of an accumulation layer at the GOLD region, whereby a high electric field is generated in the proximity of the source region and the drain region having an impurity concentration higher than that of the GOLD region. Therefore, leakage current could not be suppressed reliably.

Further, application of a voltage to the drain higher than that to the gate will generate a relatively large electric field at the junction region of the drain side. Electrons accelerated by this electric field induce impact ionization, whereby a pair of an electron and hole is generated. Impact ionization is repeated to increase the pairs of electrons and holes, causing increase in the drain current to result in avalanche breakdown. The drain voltage at this stage becomes the source-drain breakdown voltage.

Since the electric field in the proximity of the drain region is alleviated at the junction between the channel region and the GOLD region in the thin film transistor of a GOLD structure set forth above, impact ionization can be suppressed to a certain level. However, there was a problem that sufficient source-drain breakdown voltage could not be achieved by a GOLD region with the length in the direction of the channel length (GOLD length) under practical usage.

Similar problems are encountered in other examples of thin film transistors of an LDD structure. Specifically, when a channel is formed at the channel region in response to application of a positive voltage as the gate voltage, the resistance of the LDD region will be connected in series with respect to the channel resistance. Since the impurity concentration of the LDD region is lower than the impurity concentration of the source region and the drain region, the resistance at the LDD region will become higher to lead to the problem of lower ON current.

Since the electric field in the proximity of the drain region is alleviated at the junction between the channel region and the LDD region, impact ionization can be suppressed to a certain level. However, sufficient source-drain breakdown voltage as well as reliability with respect to AC stress could not be achieved by an LDD region with the length in the direction of the channel length (LDD length) under practical usage. Thus, conventional thin film transistors had the problem that sufficient source-drain breakdown voltage could not be achieved.

SUMMARY OF THE INVENTION

In view of the foregoing, an object of the present invention is to provide a semiconductor device improved in source-drain breakdown voltage.

Another object of the present invention is to provide an image display apparatus including an image display circuit unit to which such a semiconductor device is applied.

According to an aspect of the present invention, a semiconductor device includes a semiconductor element having a semiconductor layer, an insulation film, and an electrode formed on a predetermined substrate. The semiconductor element includes a first impurity region, a second impurity region, a channel region, a third impurity region, and a fourth impurity region. The first impurity region is formed at the semiconductor layer. The second impurity region is formed at the semiconductor layer with a distance from the first impurity region. The channel region is formed, functioning as a channel having a predetermined channel length, at a portion of the semiconductor layer located between the first impurity region and the second impurity region. The third impurity region is formed at a portion of the semiconductor layer located between the second impurity region and the channel region, and in contact with the channel region. The fourth impurity region is formed at a portion of the semiconductor layer located between the second impurity region and the third impurity region. In the semiconductor element, an electrode has one side and another side opposite to each other. The fourth impurity region is coupled with the second impurity region and the third impurity region. An end of the first impurity region at the channel region side is located substantially on the same plane as the one side, and a junction between the third impurity region and the fourth impurity region is located substantially on the same plane as the another side. The electrode is formed overlapping with and facing each of the channel region and the third impurity region entirely. The insulation film is formed between the semiconductor layer and the electrode so as to come into contact with each of the semiconductor layer and the electrode. The impurity concentration of the third impurity region and the fourth impurity region is set lower than the impurity concentration of each of the first impurity region and the second impurity region, and set higher than the impurity concentration of the channel region. The impurity concentration of each of the third impurity region is set to be different from the impurity concentration of the fourth impurity region.

According to another aspect of the present invention, a semiconductor device includes a semiconductor element having a semiconductor layer, an insulation film, and an electrode formed on a predetermined substrate. The semiconductor element includes a first impurity region, a second impurity region, a channel region, a third impurity region, a fourth impurity region, and a fifth impurity region. The first impurity region is formed at the semiconductor layer. The second impurity region is formed at the semiconductor layer, with a distance from the first impurity region. The channel region is formed, functioning as a channel having a predetermined channel length at a portion of the semiconductor layer located between the first impurity region and the second impurity region, with respective distances from the first and second impurity regions. The third impurity region is formed at a portion of the semiconductor layer located between the second impurity region and the channel region, and in contact with the channel region. The fourth impurity region is formed at a portion of the semiconductor layer located between the second impurity region and the third impurity region. The fifth impurity region is formed at a portion of the semiconductor layer located between the first impurity region and the channel region. At the semiconductor element, an electrode includes one side and another side opposite to each other. The fourth impurity region is coupled with the second impurity region and the third impurity region. The fifth impurity region is coupled with the first impurity region. An end of the fifth impurity region at the channel region side is located substantially on the same plane as the one side, and a junction between the third impurity region and the fourth impurity region is located substantially on the same plane as the another side. The electrode is formed overlapping with and facing each of the channel region and the third impurity region entirely. The insulation film is formed between the semiconductor layer and the electrode so as to be in contact with each of the semiconductor layer and the electrode. The impurity concentration of each of the third to fifth impurity regions is set lower than the impurity concentration of the first impurity region and the second impurity region, and set higher than the impurity concentration of the channel region. The impurity concentration of the third impurity region is set to be different from the impurity concentration of the fourth impurity region and the fifth impurity region. The length of the fifth impurity region in the direction of the channel length is set shorter than the length of the fourth impurity region in the direction of the channel length.

According to an aspect of the present invention, an image display apparatus includes an image display circuit unit to display an image. The image display circuit unit includes a semiconductor element having a semiconductor layer, an insulation film, and an electrode formed on a predetermined substrate. The semiconductor element includes at least one of a predetermined first element and a second element. The first element includes a first impurity region, a second impurity region, a channel region, a third impurity region, and a fourth impurity region. The first impurity region is formed at the semiconductor layer. The second impurity region is formed at the semiconductor layer with a distance from the first impurity region. The channel region is formed, functioning as a channel having a predetermined channel length, at a portion of the semiconductor layer located between the first impurity region and the second impurity region. The third impurity region is formed at a portion of the semiconductor layer located between the second impurity region and the channel region, and in contact with the channel region. The fourth impurity region is formed at a portion of the semiconductor layer located between the second impurity region and the third impurity region. In the first element, an electrode has one side and another side opposite to each other. The fourth impurity region is coupled with the second impurity region and the third impurity region. An end of the first impurity region at the channel region side is located substantially on the same plane as the one side, and a junction between the third impurity region and the fourth impurity region is located substantially on the same plane as the another side. The electrode is formed overlapping with and facing each of the channel region and the third impurity region entirely. The insulation film is formed between the semiconductor layer and the electrode so as to come into contact with each of the semiconductor layer and the electrode. The impurity concentration of the third impurity region and the fourth impurity region is set lower than the impurity concentration of each of the first impurity region and the second impurity region, and set higher than the impurity concentration of the channel region. The impurity concentration of the third impurity region is set to be different from the impurity concentration of the fourth impurity region. The second element includes a fifth impurity region, a sixth impurity region, a channel region, a seventh impurity region, an eighth impurity region, and a ninth impurity region. The fifth impurity region is formed at the semiconductor layer. The sixth impurity region is formed at the semiconductor layer with a distance from the fifth impurity region. The channel region functions as a channel having a predetermined channel length, at a portion of the semiconductor layer located between the fifth impurity region and the sixth impurity region, with respective distances from the fifth impurity region and the sixth impurity region. The seventh impurity region is formed to come into contact with the channel region at a portion of the semiconductor layer located between the sixth impurity region and the channel region. The eighth impurity region is formed at a portion of the semiconductor layer located between the sixth impurity region and the seventh impurity region. The ninth impurity region is formed at a portion of the semiconductor layer located between the fifth impurity region and the channel region. At the second element, an electrode has one side and another side opposite to each other. The eighth impurity region is coupled with the sixth impurity region and the seventh impurity region. The ninth impurity region is coupled with the fifth impurity region. An end of the ninth impurity region at the channel region side is located substantially on the same plane as the one side, and a junction between the seventh impurity region and the eighth impurity region is located substantially on the same plane as the other side. The electrode is formed overlapping with and facing each of the channel region and the seventh impurity region, entirely. The insulation film is formed between the semiconductor layer and the electrode to come into contact with the semiconductor layer and the electrode. The impurity concentration of each of the seventh to ninth impurity regions is set lower than each impurity concentration of the fifth impurity region and the sixth impurity region, and set higher than the impurity concentration of the channel region. The impurity concentration of the seventh impurity region is set different from each impurity concentration of the eighth impurity region and the ninth impurity region. The length of the ninth impurity region in the direction of the channel length is set shorter than the length of the eighth impurity region in the direction of the channel length.

In accordance with the semiconductor device of the present invention, the electric field in the proximity of the second impurity region (drain) of the semiconductor element is alleviated by two junctions, i.e. the junction between the channel region and the third impurity region (GOLD region) and the junction between the third impurity region and the fourth impurity region (LDD region). Accordingly, breakdown voltage can be achieved between the first impurity region (source) and the second impurity region (drain) in the semiconductor element. The third impurity region is formed overlapping with the electrode, and when a channel is formed at the channel region, a channel is formed at the third impurity region such that the third impurity region will not adversely affect the ON current of the semiconductor element. Since the fourth impurity region is formed only at the second impurity region side, an ON current higher than that of a semiconductor device of a conventional LDD structure can be achieved, and increase in the area occupied by the semiconductor element can be suppressed.

According to another semiconductor device of the present invention, the electric field in the proximity of the second impurity region (drain) at the semiconductor element is alleviated by two junctions, i.e. the junction between the channel region and the third impurity region (GOLD region) and the junction between the third impurity region and the fourth impurity region. Accordingly, breakdown voltage can be achieved between the first impurity region (source) and the second impurity region (drain) in the semiconductor element. The third impurity region is formed overlapping with the electrode, and when a channel is formed at the channel region, a channel is formed also at the third impurity region such that the third impurity region will not adversely affect the ON current of the semiconductor element. Since the length of the fifth impurity region in the direction of the channel length is set shorter than the length of the fourth impurity region in the direction of the channel length, increase of the area occupied by the semiconductor element can be minimized.

In accordance with the image display apparatus of the present invention, the electric field in the proximity of the second impurity region (drain region) in the first element is alleviated by two junctions, i.e. the junction between the channel region and the third impurity region (GOLD region) and the junction between the third impurity region and the fourth impurity region (LDD region). Accordingly, breakdown voltage can be achieved between the first impurity region (source) and the second impurity region (drain) in the semiconductor element. The third impurity region is formed overlapping with the electrode, and when a channel is formed at the channel region, a channel is formed also at the third impurity region. That third impurity region will not adversely affect the ON current of the semiconductor element. Further, since the fourth impurity region is formed only at the second impurity region side, an ON current higher than that of the semiconductor device of a conventional LDD structure can be achieved. Further, increase of the area occupied by the semiconductor element can be suppressed. At the second element, the electric field in the proximity of the second impurity region (drain) in the second element is alleviated by two junctions, i.e. the junction between the channel region and the third impurity region (GOLD region) and the junction between the third impurity region and the fourth impurity region (LDD region). Accordingly, breakdown voltage can be achieved between the first impurity region (source) and the second impurity region (drain) at the semiconductor element. The third impurity region is formed overlapping with the electrode, and when a channel is formed at the channel region, a channel is also formed at the third impurity region. That third impurity region will not adversely affect the ON current of the semiconductor element. Since the length of the fifth impurity region in the direction of the channel length is set shorter than the length of the fourth impurity region in the direction of the channel length, increase of the area occupied by the semiconductor element can be suppressed to the minimum.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 11 shows the result of source-drain breakdown voltage of the thin film transistor in the first embodiment.

FIG. 12 is a graph representing the dependency of the thin film transistor breakdown voltage ratio on the LDD length in the first embodiment.

FIG. 13 is a graph representing the dependency of the thin film transistor area ratio on the gate electrode width in the first embodiment.

FIG. 26 is a graph representing the dependency of the thin film transistor ON current ratio on the LDD length in the second embodiment.

FIG. 27 shows the results of a source-drain breakdown voltage of the thin film transistor of the second embodiment.

FIG. 28 is a graph representing the dependency of the thin film transistor breakdown voltage ratio on the LDD length in the second embodiment.

FIG. 37 shows the result of source-drain breakdown voltage of the thin film transistor in the third embodiment.

FIG. 38 is a graph representing the dependency of the thin film transistor breakdown voltage ratio on the LDD length in the third embodiment.

FIG. 39 is a graph representing the dependency of the thin film transistor area ratio on the gate electrode width in the third embodiment.

FIG. 48 is a graph representing the dependency of the thin film transistor ON current ratio on the LDD length at the drain side in the fourth embodiment.

FIG. 49 shows the results of a source-drain breakdown voltage of the thin film transistor of the fourth embodiment.

FIG. 50 is a graph representing the dependency of the thin film transistor breakdown voltage ratio on the LDD length at the source side in the fourth embodiment.

DESCRIPTION OF THE PREFERRED EMBODIMENTS

First Embodiment

Figure 1:
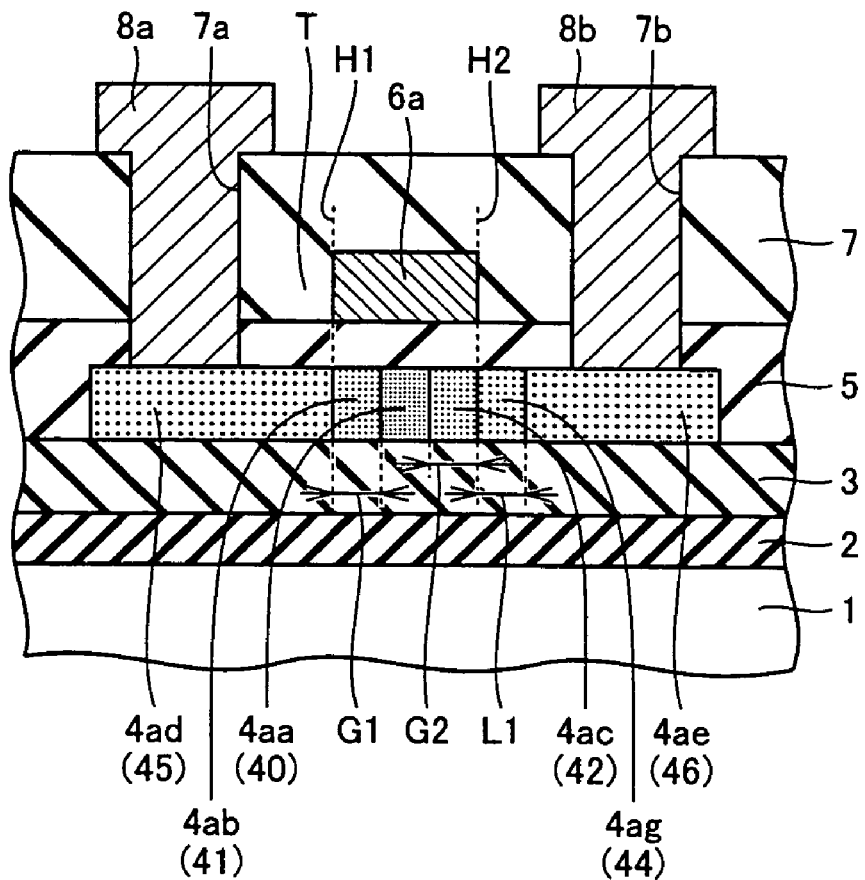
FIG. 1 is a sectional view of a semiconductor device according to a first embodiment of the present invention.

A semiconductor device according to a first embodiment of the present invention will be described hereinafter. Referring to FIG. 1, a silicon nitride film 2 is formed on a glass substrate 1. A silicon oxide film 3 is formed on silicon nitride film 2. An island-shaped polycrystalline silicon film is formed on silicon oxide film 3. At the polycrystalline silicon film are formed a source region 45 having a predetermined impurity concentration, and a drain region 46 spaced apart from source region 45, and having a predetermined impurity concentration.

At the region located between source region 45 and drain region 46, a channel region 40 is formed with respective distances from source region 45 and drain region 46. Channel region 40 functions as a channel having a predetermined channel length. At the region between source region 45 and channel region 40, a GOLD region 41 is formed. At the region located between drain region 46 and channel region 40, an LDD region 44 is formed at the side of drain region 46, and a GOLD region 42 is formed at the side of channel region 40.

The impurity concentration of each of LDD region 44 and GOLD regions 41 and 42 is set higher than the impurity concentration of channel region 40, and set lower than the impurity concentration of source region 45 and drain region 46. Further, the impurity concentration of LDD region 44 is set higher than the impurity concentration of GOLD regions 41 and 42. A gate insulation film 5 of a silicon oxide film is formed so as to cover the island-shaped polycrystalline silicon film. A gate electrode 6a is formed on gate insulation film 5. An interlayer insulation film 7 of, for example, a silicon oxide film, is formed so as to cover gate electrode 6a.

A contact hole 7a exposing the surface of source region 45 and a contact hole 7b exposing the surface of drain region 46 are formed at interlayer insulation film 7. A source electrode 8a and a drain electrode 8b are formed on interlayer insulation film 7 so as to fill contact holes 7a and 7b. Gate electrode 6a, source region 45, drain region 46, LDD region 44, GOLD regions 41 and 42, and channel region 40 constitute an n channel thin film transistor T. Particularly, gate electrode 6a is formed to cover the entirety of channel region 40 and overlapping with GOLD regions 41 and 42 in plane.

In other words, the junction between one GOLD region 41 and source region 45 is located substantially on the same plane H1 as one side of gate electrode 6a, whereas the junction between the other GOLD region 42 and LDD region 44 is located substantially on the same plane H2 as the other side of gate electrode 6a.

Figure 2:
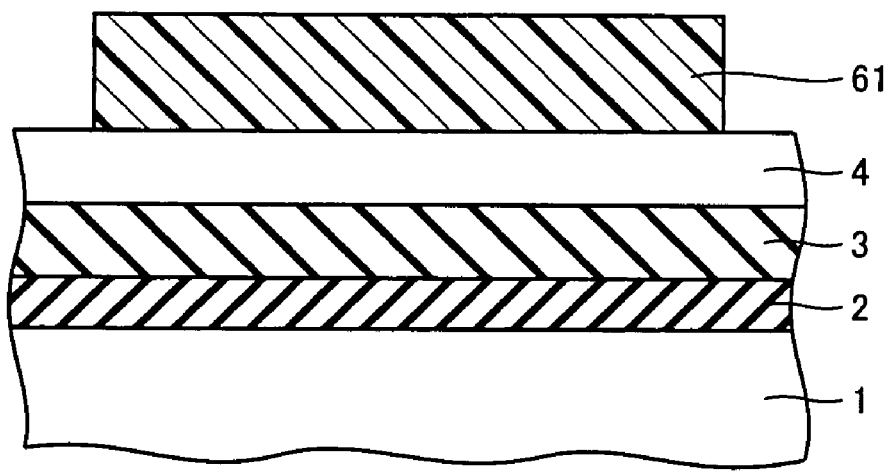
FIG. 2 is a sectional view of the semiconductor device of FIG. 1 representing a step of a fabrication method thereof.

An example of a fabrication method of the semiconductor device set forth above will be described here. Referring to FIG. 2, silicon nitride film 2 of approximately 100 nm in film thickness is deposited by plasma CVD (Chemical Vapor Deposition), for example, on the main surface of a glass substrate 1 of Type 1737 made by Corning Inc. Silicon oxide film 3 is formed to a thickness of approximately 100 nm on silicon nitride film 2. Then, an amorphous silicon film of approximately 50 nm in film thickness (refer to polycrystalline silicon film 4) is formed on silicon oxide film 3.

Silicon nitride film 2 is provided to prevent the impurities included in glass substrate 1 from diffusing upwards. As a film to prevent such impurity diffusion, the material of SiON, SiC, AlN, $Al_2O_3$, and the like may be applied in addition to the silicon nitride film. Although a double-layer structure of silicon nitride film 2 and silicon oxide film 3 is provided as the underlying film of amorphous silicon film 4, the present invention is not limited to such a double-layer structure. Such films may be omitted, or another film may be additionally layered.

By subjecting the amorphous silicon film to heat treatment in predetermined vacuum, hydrogen, present in amorphous silicon film 4 and that is not required, is removed. Then, the amorphous silicon film is irradiated with a laser beam by XeCl laser, for example, to be rendered polycrystalline, resulting in a polycrystalline silicon film 4, as shown in FIG. 2. Polycrystalline silicon film 4 has a grain size of approximately 0.5 μm.

Additionally, YAG laser, CW laser, or the like can be used instead of the XeCl laser. Furthermore, the amorphous silicon film may be rendered polycrystalline by thermal annealing. In the event of applying thermal annealing, polycrystalline silicon of a larger grain size can be obtained by using a catalyst such as nickel. A resist pattern 61 is formed on polycrystalline silicon film 4.

Figure 3:
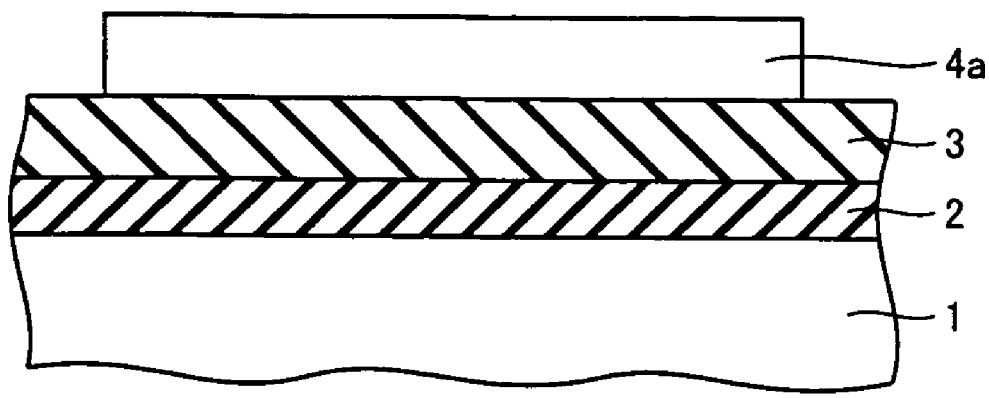
FIG. 3 is a sectional view of the semiconductor device of FIG. 1 representing a step carried out after the step of FIG. 2.

As shown in FIG. 3, polycrystalline silicon film 4 is subjected to anisotropic etching with resist pattern 61 as a mask, resulting in an island-shaped polycrystalline silicon film 4a. Then, predetermined ashing and chemical treatment are applied to remove resist pattern 61.

Figure 4:
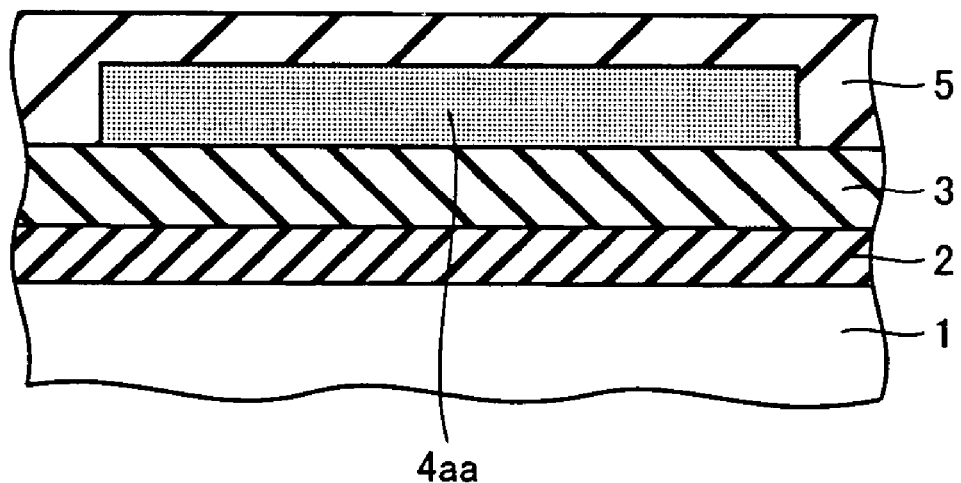
FIG. 4 is a sectional view of the semiconductor device of FIG. 1 representing a step carried out after the step of FIG. 3.

Referring to FIG. 4, a gate insulation film 5 formed of a silicon oxide film is deposited by plasma CVD, for example, to a thickness of approximately 100 nm so as to cover polycrystalline silicon film 4a. In this case, liquid TEOS (Tetra Ethyl Ortho Silicate) is employed as the base material of the silicon oxide film.

To control the threshold value of the thin film transistor, boron is implanted into polycrystalline silicon film 4a with a dosage of $1 \times 10^{12}$ atom/$cm^2$ and acceleration energy of 60 KeV, for example, whereby impurity region 4aa is formed. This implantation process is to be carried out as necessary, and may be omitted.

Figure 5:
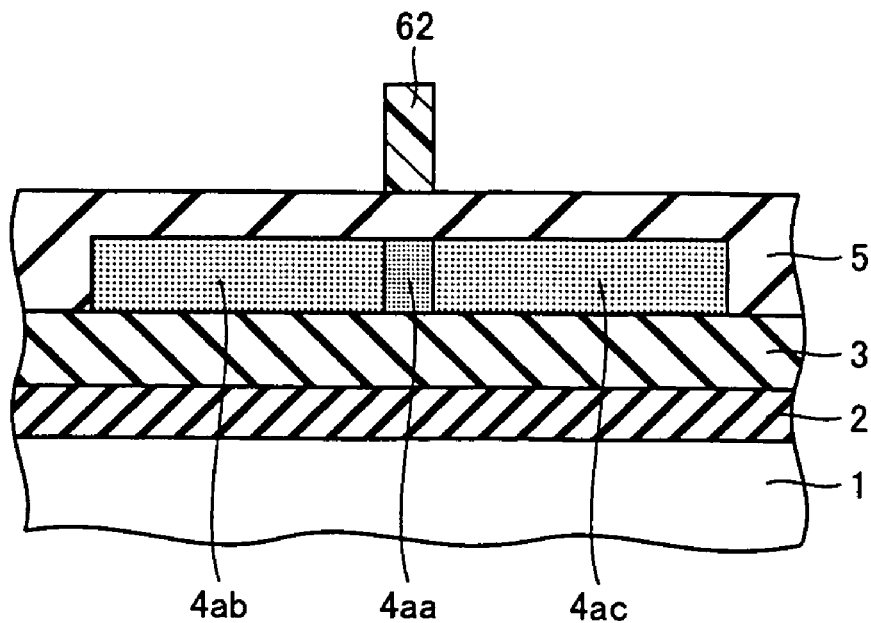
FIG. 5 is a sectional view of the semiconductor device of FIG. 1 representing a step carried out after the step of FIG. 4.

Referring to FIG. 5, predetermined photolithography is applied to form a resist pattern 62. Then, phosphorus is implanted into impurity region 4aa (polycrystalline silicon film 4aa) with a dosage of $5 \times 10^{12}$ atom/$cm^2$ and acceleration energy of 80 KeV, for example, using resist pattern 62 as a mask, to obtain impurity regions 4ab and 4ac.

The implanted amount thereof corresponds to the amount of implantation (impurity concentration) of the GOLD region. An impurity region 4aa functioning as a channel is formed between impurity regions 4ab and 4ac. Then, ashing and chemical treatment are applied to remove resist pattern 62.

Then, a chromium film (not shown) of approximately 400 nm in film thickness is formed all over gate insulation film 5 by sputtering. Then, predetermined photolithography is applied to form a resist pattern 63 (refer to FIG. 6).

Figure 6:
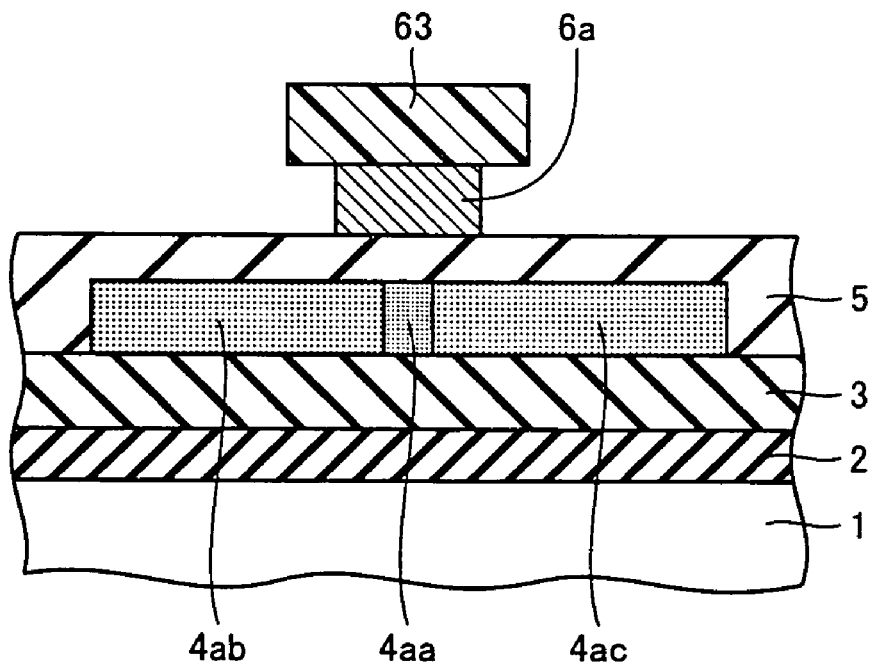
FIG. 6 is a sectional view of the semiconductor device of FIG. 1 representing a step carried out after the step of FIG. 5.

The chromium film is subjected to wet etching using resist pattern 63 as a mask, whereby a gate electrode 6a is obtained, as shown in FIG. 6. Gate electrode 6a is formed so as to overlap in plane with impurity regions 4ab and 4ac located with impurity region 4aa therebetween. The region overlapping with gate electrode 6a in plane in impurity regions 4ab and 4ac becomes the GOLD region.

In the wet etching step, the side surface of exposed chromium film 6 is etched. The etched amount thereof can be controlled by the period of time of overetching. Then, ashing and chemical treatment are applied to remove resist pattern 63.

Figure 7:
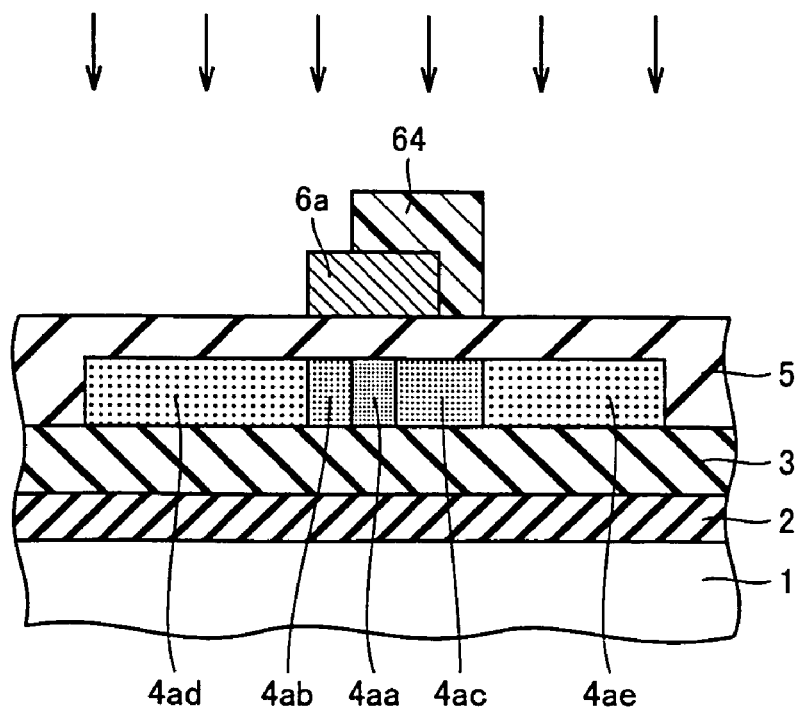
FIG. 7 is a sectional view of the semiconductor device of FIG. 1 representing a step carried out after the step of FIG. 6.

Referring to FIG. 7, predetermined photolithography is applied to form a resist pattern 64. Resist pattern 64 is formed to overlap with the portion of the polycrystalline silicon film located at the drain region side (portion of impurity region 4ac), and not overlap with the portion of the polycrystalline silicon film located at the source region side (portion of impurity region 4ab). The portion overlapping with resist pattern 64 and impurity region 4ac corresponds to the LDD region. An LDD region will not be formed at the source region side since resist pattern 64 does not overlap with impurity region 4ab.

Using resist pattern 64 as a mask, phosphorus is implanted into impurity regions 4ab and 4ac with a dosage of $1\times10^{14}$ atoms/cm$^2$ and acceleration energy of 80 KeV, for example, to obtain impurity regions 4ad and 4ae corresponding to a source region and a drain region, respectively. Then, ashing and chemical treatment are applied to remove resist pattern 64.

Figure 8:
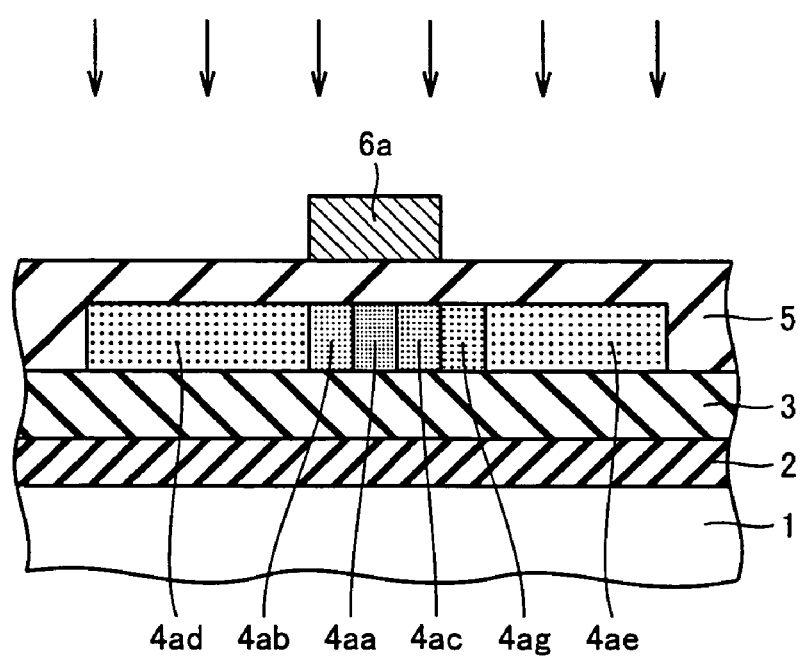
FIG. 8 is a sectional view of the semiconductor device of FIG. 1 representing a step carried out after the step of FIG. 7.

As shown in FIG. 8, using gate electrode 6a as a mask, phosphorus is implanted with a dosage of $1\times10^{13}$ atoms/cm$^2$ and acceleration energy of 80 KeV, for example, to form impurity region 4ag that becomes the LDD region at the remaining portion of impurity region 4ac. The impurity concentration of impurity region 4ag that becomes an LDD region is determined depending upon this implanted amount of phosphorus and the implanted amount of phosphorus directed to forming the GOLD region.

Thus, impurity region 4ag that becomes an LDD region is formed at only the drain region side. By forming impurity region 4ag, the impurity concentration of impurity regions 4ab and 4ac functioning as GOLD regions becomes lower than the impurity concentration of impurity region 4ag.

Figure 9:
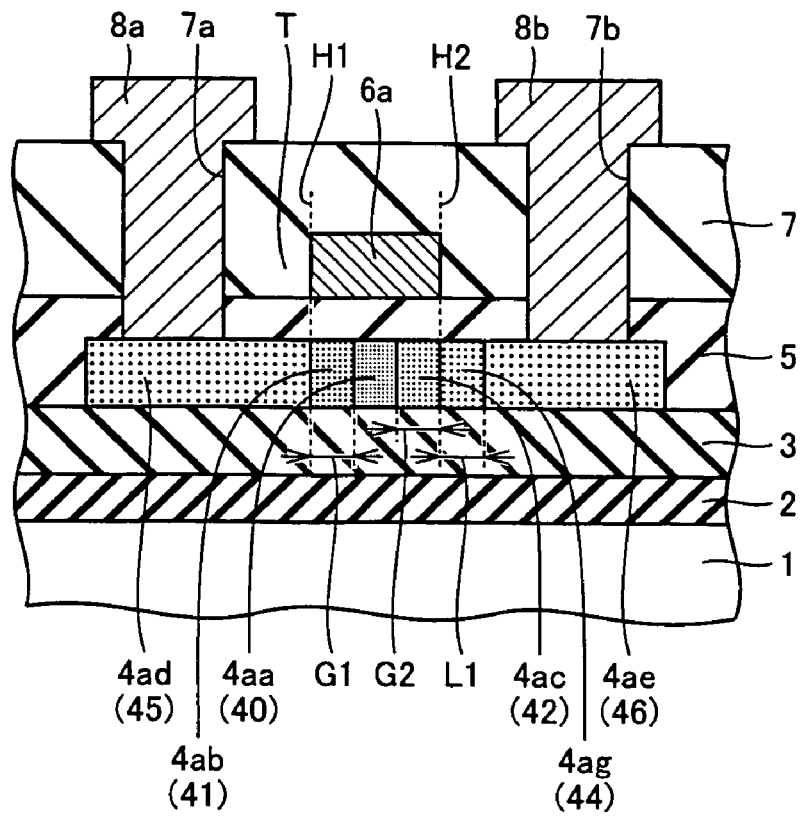
FIG. 9 is a sectional view of the semiconductor device of FIG. 1 representing a step carried out after the step of FIG. 8.

As shown in FIG. 9, interlayer insulation film 7 of a silicon oxide film is formed to a thickness of approximately 400 nm by plasma CVD, for example, so as to cover gate electrode 6a. Then, predetermined photolithography is applied on interlayer insulation film 7, whereby a resist pattern (not shown) to form a contact hole is obtained. Using that resist pattern as a mask, interlayer insulation film 7 and gate insulation film 5 are subjected to anisotropic etching, whereby a contact hole 7a exposing the surface of impurity region 4ad and a contact hole 7b exposing the surface of impurity region 4ae are formed.

Then, a multilayer film of a chromium film and aluminum film (not shown) is formed on interlayer insulation film 7 so as to fill contact holes 7a and 7b. Predetermined photolithography is applied on the multilayer film, whereby a resist pattern (not shown) required to form an electrode is obtained. Wet etching is applied using this resist pattern as a mask to obtain a source electrode 8a and a drain electrode 8b.

Thus, the main part of a semiconductor device including an n channel thin film transistor T is formed. In this thin film transistor T, impurity regions 4ad and 4ae are identified as source region 45 and drain region 46, respectively; impurity region 4ag is identified as LDD region 44; impurity regions 4ab and 4ac are identified as GOLD regions 41 and 42, respectively; and impurity region 4aa is identified as channel region 40. LDD region 44 is formed only at the drain region 46 side, and has a predetermined length L1 in the direction of the channel length. GOLD regions 41 and 42 have predetermined lengths G1 and G2 in the direction of the channel length. Although lengths G1 and G2 are set substantially the same in this case, lengths G1 and G2 may differ therebetween.

The results of measuring the amount of impurities (impurity concentration) implanted in the GOLD region and LDD region of a thin film transistor formed by a fabrication method set forth above using an SIMS (Secondary Ion Mask Spectrometer) will be described here. First, a control specimen was fabricated in a manner similar to that of forming a thin film transistor. Specifically, a silicon nitride film of approximately 100 nm in film thickness, a silicon oxide film of approximately 100 nm in film thickness, and an amorphous silicon film of approximately 50 nm in film thickness were sequentially formed on a glass substrate, followed by a predetermined laser annealing process on the amorphous silicon film.

Then, following formation of a silicon oxide film of approximately 100 nm in film thickness, ion implantation of phosphorus required to form a GOLD region and ion implantation of phosphorus required to form an LDD region were carried out. The amount of impurities implanted were measured by SIMS. As a result, the amount of impurities (concentration) corresponding to the GOLD region was $5\times10^{17}$ atoms/cm$^3$, whereas the amount of impurities (concentration) corresponding to the LDD region was $5\times10^{18}$ atoms/cm$^3$.

Various electrical measurements were conducted on thin film transistor T set forth above. For the measurement, a thin film transistor of the following parameters was employed: gate width 10 µm; gate length 5 µm, length of GOLD regions 41 and 42 in direction of channel length 1 µm; length of gate electrode in direction of channel length 7 µm; length of LDD region 44 in direction of channel length 0.5-4 µm.

The measured results of ON current will be described first. To obtain measurements, 8V and 5V were applied to the gate and drain, respectively, with the source connected to ground. The drain current measured at this stage was taken as the ON current. For comparison, measurements on a thin film transistor of a conventional LDD structure were conducted. The thin film transistor of the conventional LDD structure had the following parameters: gate width 10 µm; gate length 5 µm; and length of LDD region in direction of channel length 1 µm.

Figure 10:
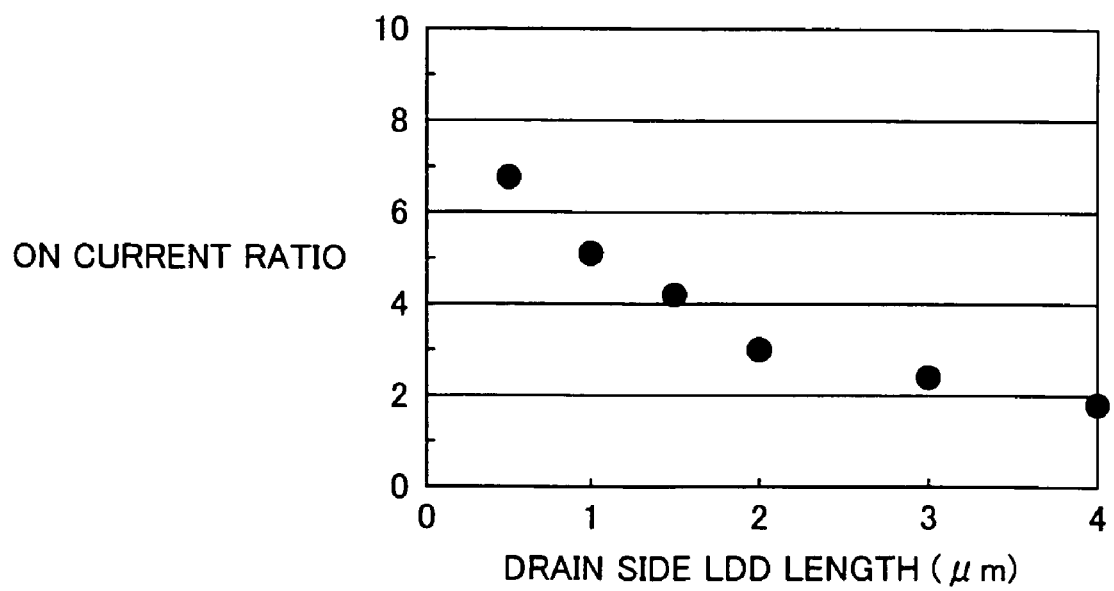
FIG. 10 is a graph representing the dependency of the ON current ratio of the thin film transistor on the LDD length in the first embodiment.

The measured results of ON current are shown in FIG. 10. In FIG. 10, the vertical axis corresponds to the ratio of the ON current of a thin film transistor of the present embodiment to the ON current of a thin film transistor of a conventional LDD structure (ON current of present embodiment/ON current of conventional case), whereas the horizontal axis corresponds to the length of the LDD region in the direction of the channel length (LDD length). As shown in FIG. 10, it was confirmed that the ON current of the thin film transistor of the present embodiment is increased significantly as compared to that of the thin film transistor of a conventional LDD structure. Particularly, it was identified that the tendency of the ratio thereof becoming higher is more noticeable when the LDD length is not more than 2 µm. It was found that the LDD length is desirably not more than 2 µm.

The results of the measurement of the source-drain breakdown voltage will be described hereinafter. In the measurement, the gate voltage was set to 0V, and the source was connected to ground. The drain voltage when the drain current is 0.1 µA is defined as the source-drain breakdown voltage. For comparison, measurement was conducted using a thin film transistor of a conventional LDD structure (Comparative Example 1), and a thin film transistor with an LDD region and GOLD region at both sides of the source region and the drain region (Comparative Example 2). In these thin film transistors, the length of the GOLD region and the LDD region in the direction of the channel length was both set to 1 µm.

FIG. 11 shows the measurement results of the source-drain breakdown voltage. It is appreciated from FIG. 11 that the thin film transistor of the GOLD structure according to the first embodiment can achieve a source drain breakdown voltage higher than that of the thin film transistor of Comparative Example 1. It was confirmed that the source-drain breakdown voltage of the thin film transistor set forth above is substantially equal to the source-drain breakdown voltage of the thin film transistor of Comparative Example 2.

The ratio of the source-drain breakdown voltage of the thin film transistor of the present embodiment to the source-drain breakdown voltage of the thin film transistor of Comparative Example 2 on the LDD length is shown in FIG. 12. It is appreciated from FIG. 12 that the source-drain breakdown voltage of the thin film transistor of the present embodiment is substantially equal to the source drain breakdown voltage of the thin film transistor of Comparative Example 2, regardless of the LDD length.

The occupying area of the thin film transistor will be described hereinafter. FIG. 13 is a graph representing the dependency of the occupying area ratio of the thin film transistor of the GOLD structure of the present embodiment to the thin film transistor of a conventional LDD structure on the gate electrode width.

In the graph of FIG. 13, the vertical axis (the area ratio of thin film transistors) represents the ratio (present embodiment/conventional case) of the area of the region where the thin film transistor of a GOLD structure according to the present invention is formed (occupying area) to the area of the region where a conventional thin film transistor is formed (occupying area). The occupying area is substantially the area of the region including the LDD region, GOLD region, and channel region. It is appreciated from FIG. 13 that the occupying area can be reduced in accordance with the thin film transistor of the present embodiment, as compared to that of the conventional thin film transistor. Particularly in the case where the gate electrode width becomes shorter in accordance with microminiaturization of the semiconductor device, the advantage of reducing the area becomes more significant by the thin film transistor of the present embodiment as compared to a conventional thin film transistor.

Modification

The above description is based on the case of an n channel thin film transistor as the thin film transistor set forth above. A p channel thin film transistor is formed at the same time on the glass substrate. A fabrication method of a p channel thin film transistor will be described hereinafter, based on major steps.

Figure 14:
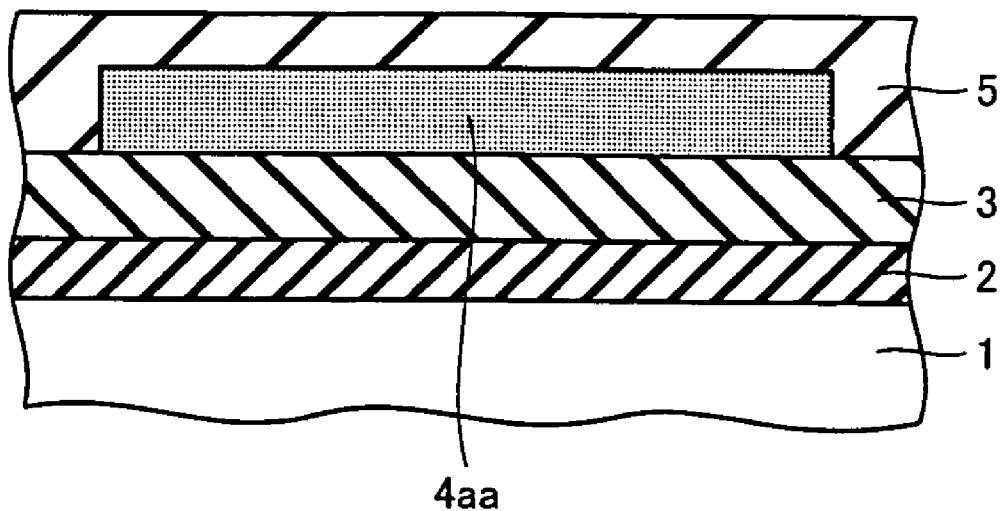
FIG. 14 is a sectional view of a modification of the thin film transistor of the first embodiment representing a step of a fabrication method thereof.
Figure 15:
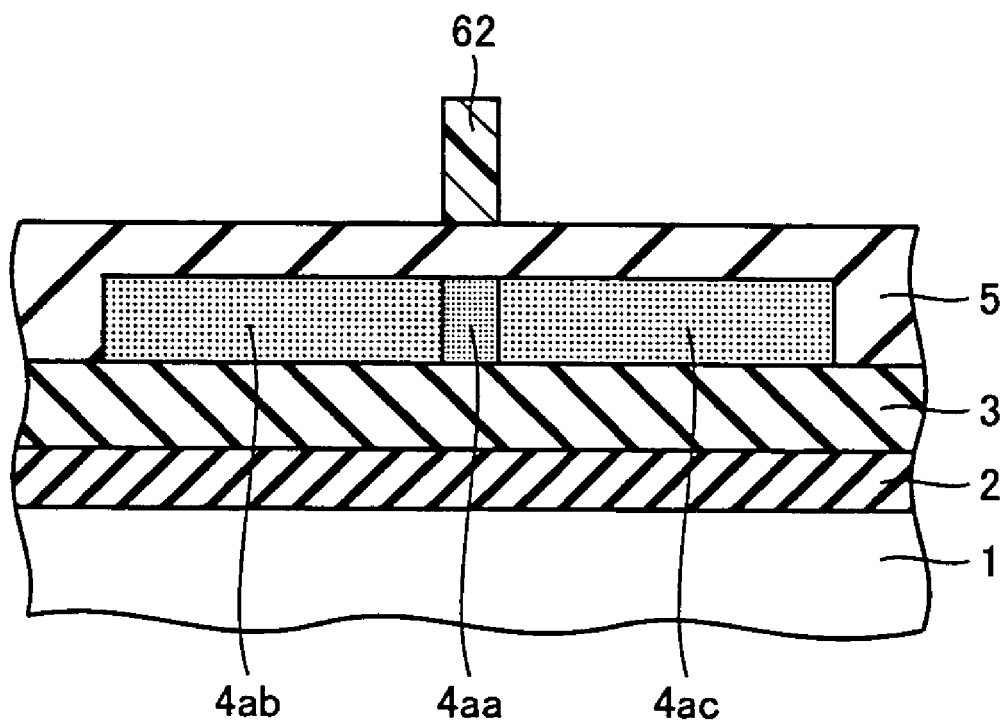
FIG. 15 is a sectional view of the thin film transistor of the first embodiment representing a step carried out after the step of FIG. 14.

A process similar to that corresponding to the steps up to FIG. 4 set forth above is carried out to obtain an impurity region 4aa in the polycrystalline silicon film, as shown in FIG. 14. Referring to FIG. 15, predetermined photolithography is applied to form a resist pattern 62. Using this resist pattern 62 as a mask, borons are implanted into the polycrystalline silicon film with a dosage of $1 \times 10^{13}$ atoms/cm$^2$ and acceleration energy of 60 KeV, for example, to obtain impurity regions 4ab and 4ac. This implanted amount corresponds to the amount of implantation at the GOLD region. Impurity region 4aa functioning as a channel is formed between impurity region 4ab and impurity region 4ac. Then, ashing and chemical treatment are applied to remove resist pattern 62.

Then, a chromium film (not shown) of approximately 400 nm in thickness is formed all over gate insulation film 5 by sputtering. Then, predetermined photolithography is applied to form resist pattern 63 (refer to FIG. 16).

Figure 16:
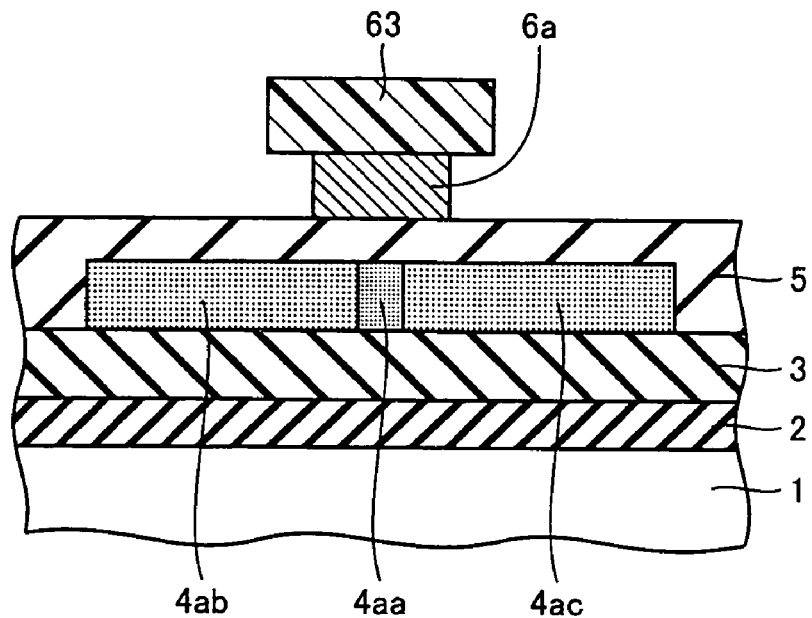
FIG. 16 is a sectional view of the semiconductor device of the first embodiment representing a step carried out after the step of FIG. 15.

Using resist pattern 63 as a mask, the chromium film is subjected to wet etching, whereby a gate electrode 6a is formed, as shown in FIG. 16. Gate electrode 6a is formed so as to overlap in plane with impurity regions 4ab and 4ac that are located with impurity region 4aa therebetween. In impurity regions 4ab and 4ac, the region overlapping in plane with gate electrode 6a is the GOLD region.

Figure 17:
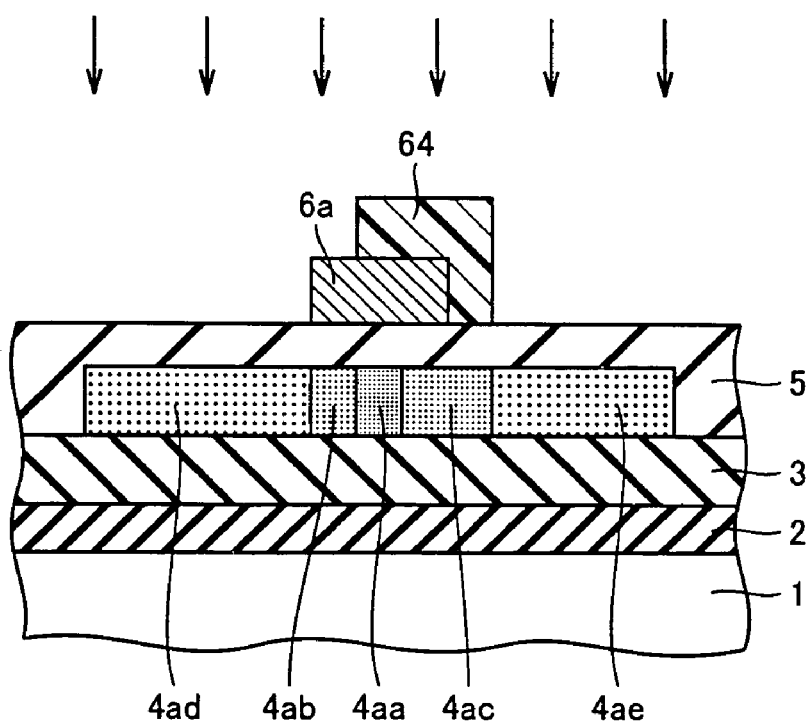
FIG. 17 is a sectional view of the semiconductor device of the first embodiment representing a step carried out after the step of FIG. 16.

Referring to FIG. 17, predetermined photolithography is applied to form resist pattern 64. Resist pattern 64 is formed so as to overlap with the portion of the polycrystalline silicon film located at the drain region side (portion of impurity region 4ac), and not overlap with the portion of the polycrystalline silicon film located at the source region side (portion of the impurity region 4ab). The overlapping portion between resist pattern 64 and impurity region 4ac becomes the LDD region. Since resist pattern 64 does not overlap with impurity region 4ab, an LDD region will not be formed at the source region side.

Using resist pattern 64 as a mask, boron is implanted into impurity regions 4ab and 4ac with a dosage of $1 \times 10^{15}$ atoms/cm$^2$ and acceleration energy of 60 KeV, for example, to obtain impurity regions 4ad and 4ae that will become the source region and the drain region. Then, ashing and chemical treatment are applied to remove resist pattern 64.

Figure 18:
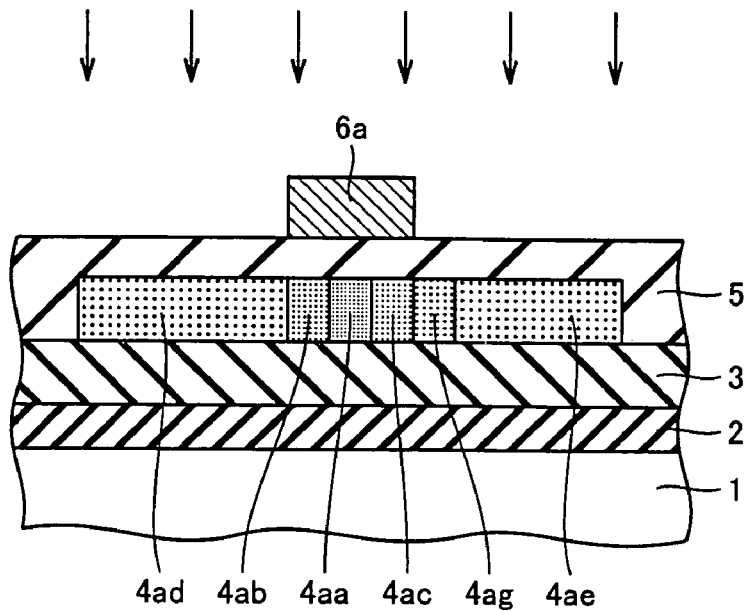
FIG. 18 is a sectional view of the semiconductor device of the first embodiment representing a step carried out after the step of FIG. 17.

Referring to FIG. 18, using gate electrode 6a as a mask, boron is implanted with a dosage of $5 \times 10^{13}$ atoms/cm$^2$ and acceleration energy of 60 KeV, for example, whereby impurity region 4ag identified as the LDD region is obtained at the portion of the remaining impurity region 4ac. The impurity concentration of impurity region 4ag identified as the LDD region depends upon the implanted amount of boron and the implanted amount of phosphorus directed to forming a GOLD region.

Figure 19:
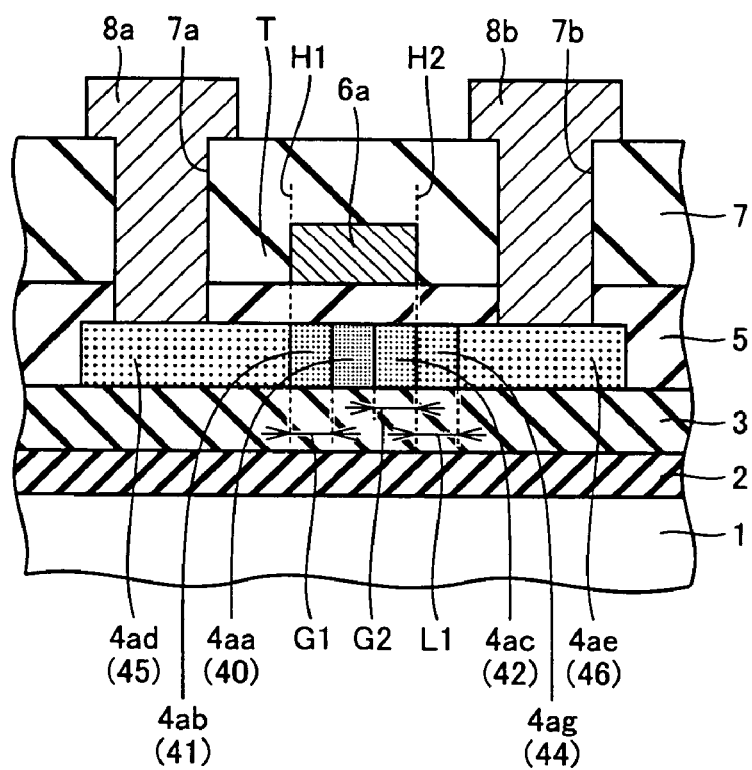
FIG. 19 is a sectional view of the semiconductor device of the first embodiment representing a step carried out after the step of FIG. 18.

Thus, impurity region 4ag identified as the LDD region will be formed only at the drain region side. By forming impurity region 4ag, the impurity concentration of impurity regions 4ab and 4ac identified as the GOLD region will become lower than the impurity concentration of impurity region 4ag. Then, a step similar to the step shown in FIG. 9 is carried out, whereby a p channel type thin film transistor T of a GOLD structure is formed, as shown in FIG. 19. Thus, a p channel thin film transistor T of a GOLD structure with LDD region 44 only at the side of drain region 46 is provided. Advantages of breakdown voltage and the like can be achieved in the p channel type thin film transistor, likewise the n channel thin film transistor set forth above.

Second Embodiment

The previous embodiment is based on the case where the thin film transistor has an LDD region whose impurity concentration is higher than the impurity concentration of the GOLD region. In the second embodiment, a thin film transistor including a GOLD region whose impurity concentration is higher than the impurity concentration of the LDD region will be taken as an example, and a fabrication method thereof will be described.

Figure 20:
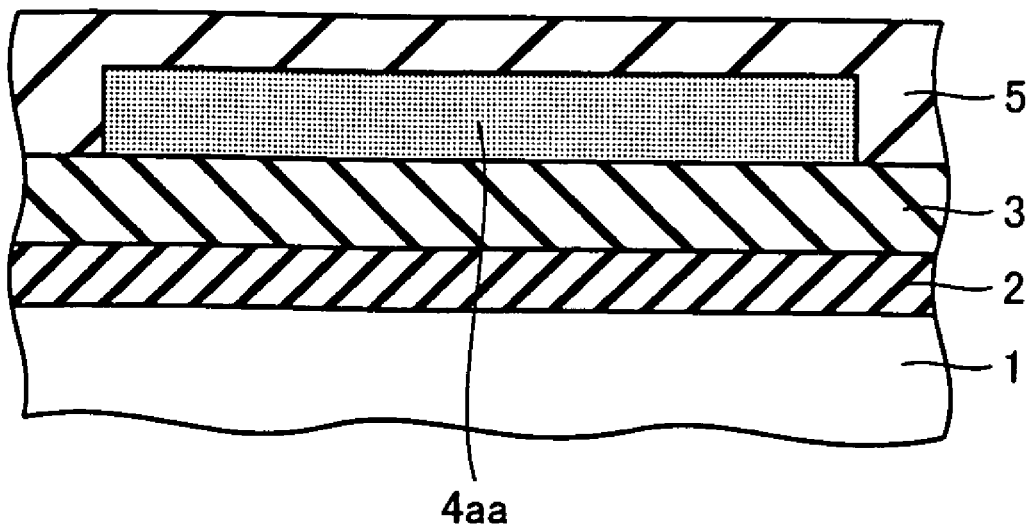
FIG. 20 is a sectional view of a semiconductor device according to a second embodiment of the present invention representing a step of a fabrication method thereof
Figure 21:
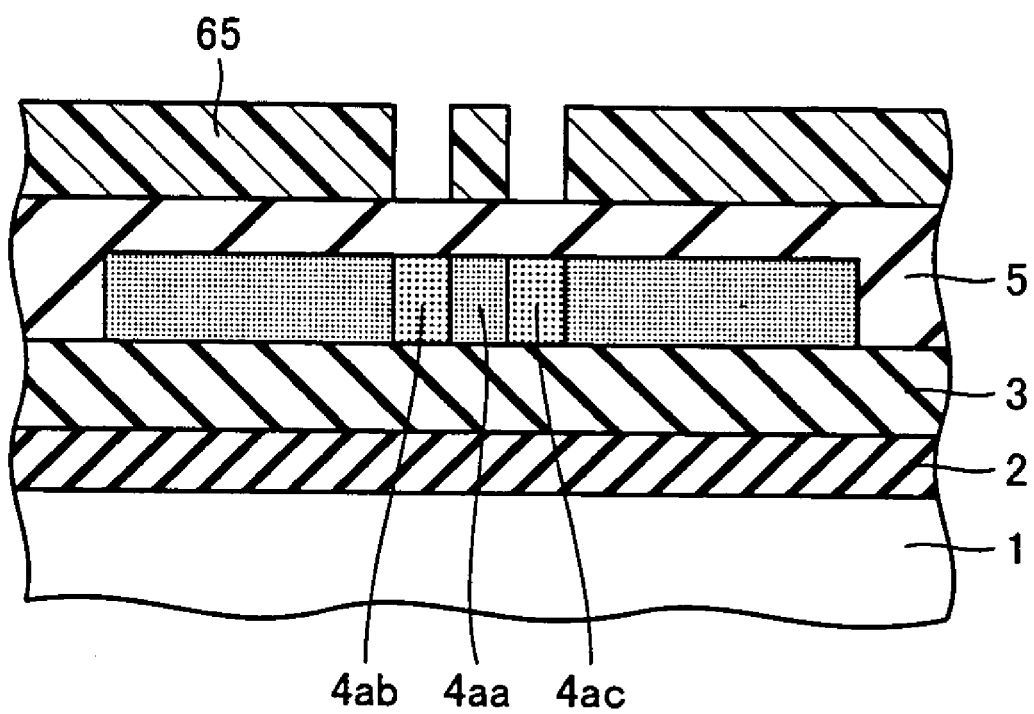
FIG. 21 is a sectional view of the semiconductor device of the second embodiment representing a step carried out after the step of FIG. 20.

The process of forming gate insulation film 5, as shown in FIG. 20, and implanting predetermined impurities directed to controlling the threshold value of the thin film transistor is similar to the process corresponding to the steps up to FIG. 4 set forth above. Then, a resist pattern 65 is formed on gate insulation film 5 by applying predetermined photolithography, as shown in FIG. 21. Using resist pattern 65 as a mask, phosphorus is implanted with a dosage of $1 \times 10^{13}$ atoms/cm$^2$ and acceleration energy of 80 KeV, for example, to obtain impurity regions 4ab and 4ac identified as the GOLD region. The implanted amount thereof corresponds to the amount of implantation in the GOLD region. Then, ashing and chemical treatment are applied to remove resist pattern 65.

Then, a chromium film (not shown) of approximately 400 nm in film thickness is formed all over gate insulation film 5 by sputtering. The chromium film is subjected to predetermined photolithography, whereby resist pattern 63 (refer to FIG. 22) is formed. Resist pattern 63 is formed so as to overlap with impurity regions 4ab and 4ac. These overlapping impurity regions 4ab and 4ac become the GOLD region.

Figure 22:
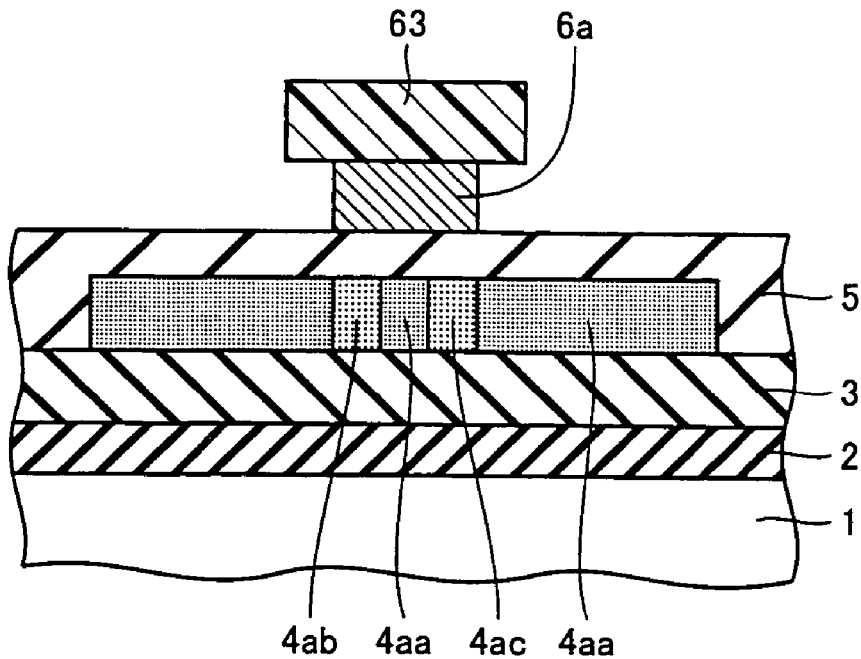
FIG. 22 is a sectional view of the semiconductor device of the second embodiment representing a step carried out after the step of FIG. 21.

Referring to FIG. 22, using resist pattern 63 as a mask, the chromium film is subjected to wet etching, whereby gate electrode 6a is formed. During the wet etching process, the sidewall of the exposed chromium film will be etched. The etched amount can be controlled by the period of overetching. Then, ashing and chemical treatment are applied to remove resist pattern 63.

Figure 23:
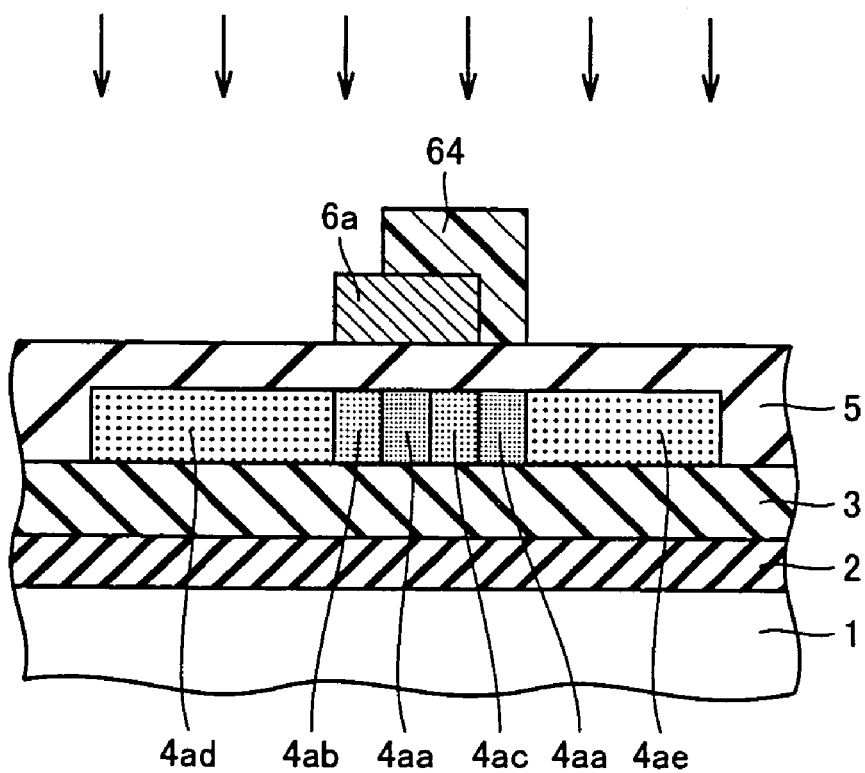
FIG. 23 is a sectional view of the semiconductor device of the second embodiment representing a step carried out after the step of FIG. 22.

Referring to FIG. 23, predetermined photolithography is applied to form resist pattern 64. Resist pattern 64 is formed so as to overlap with the portion of the polycrystalline silicon film located at the drain region side (portion of impurity region 4aa), and not to overlap with the portion of the polycrystalline silicon film located at the source region side(portion of impurity region 4aa). The overlapping region between resist pattern 64 and the portion of impurity region 4aa at the drain side becomes the LDD region. An LDD region will not be formed at the source region side since resist pattern 64 does not overlap with the portion of impurity region 4aa at the source side 4ab.

Using resist pattern 64 and gate electrode 6a as a mask, phosphorus is implanted with a dosage of $1 \times 10^{14}$ atoms/cm$^2$ and acceleration energy of 80 KeV, for example, to obtain impurity regions 4ad and 4ae identified as the source region and the drain region, respectively. Then, ashing and chemical treatment are applied to remove resist pattern 64.

Figure 24:
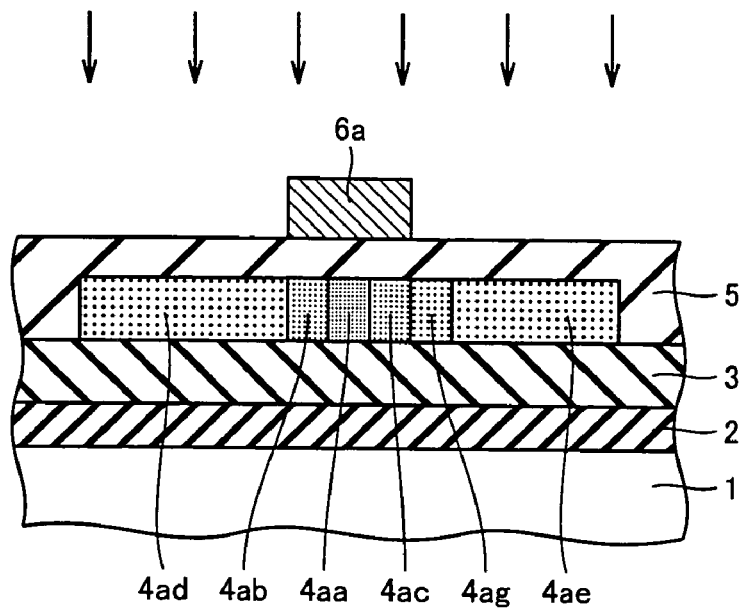
FIG. 24 is a sectional view of the semiconductor device of the second embodiment representing a step carried out after the step of FIG. 23.
Figure 25:
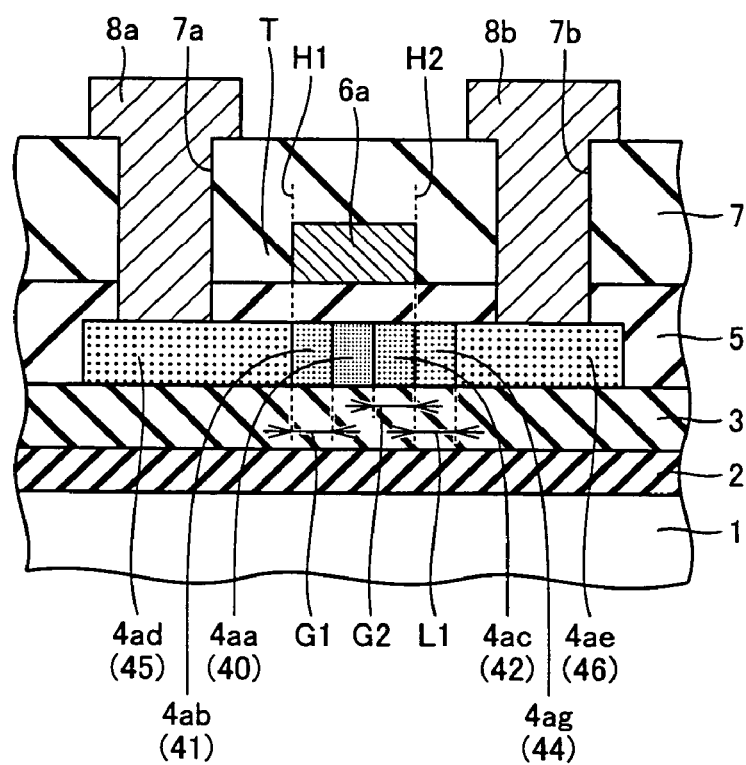
FIG. 25 is a sectional view of the semiconductor device of the second embodiment representing a step carried out after the step of FIG. 24.

Referring to FIG. 24, using gate electrode 6a as a mask, phosphorus is implanted with a dosage of $4 \times 10^{12}$ atoms/cm$^2$ and acceleration energy of 60 KeV, for example, to form impurity region 4ag identified as the LDD region at the remaining portion of impurity region 4aa.The impurity concentration of the impurity region 4ag identified as the LDD region depends upon the implanted amount of phosphorus and the implanted amount directed to forming the GOLD region. In this case, the impurity concentration of the LDD region becomes lower than the impurity concentration of the GOLD region. Further, the impurity concentration of the LDD region and GOLD region becomes lower than the impurity concentration of the source region and the drain region.

Then, a step similar to the step shown in FIG. 9 set forth above is carried out, whereby an n channel thin film transistor T of a GOLD structure including GOLD regions 41 and 42 at the source region 45 side and drain region 46 side, and LDD region 44 only at drain region 46 side is provided.

Electrical measurements on thin film transistor T set forth above were conducted. For the measurement, a thin film transistor was employed having the following parameters: gate width 10 μm; gate length 5 μm; length of GOLD regions 41 and 42 in the direction of channel length 1 μm; length of gate electrode in the direction of channel length 7 μm; and length of LDD region 44 in the direction of channel length varied from 0.5 to 4 μm.

The measured results of ON current will be first described. For the measurement, the source was connected to ground, and 8V and 5V were applied to the gate and drain, respectively. The drain current measured at this stage is taken as the ON current. For comparison, measurement was conducted using a thin film transistor of a conventional LDD structure. The thin film transistor of a conventional LDD structure had the gate width set to 10 μm, the gate length set to 5 μm, and the length of the LDD region in the direction of channel length set to 1 μm.

The measured results of ON currents are shown in FIG. 26. It was confirmed that the ON current of the thin film transistor of the present embodiment is increased significantly than that of the thin film transistor of a conventional LDD structure. Particularly, it was identified that the tendency of the ratio thereof becoming higher is more noticeable. The tendency of the ON current ratio being increased becomes noticeable when the LDD length is not more than 2 μm. It was therefore identified that the LDD length is desirably not more than 2 μm.

Measured results of source-drain breakdown voltage will be described here. For the measurement, the gate voltage was set at 0V, and the source was connected to ground. The drain voltage when the drain current is 0.1 μA is defined as the source-drain breakdown voltage.

For comparison, measurements were conducted also on a thin film transistor of a conventional LDD structure (Comparative Example 1), and a thin film transistor having an LDD region and GOLD region at both the source region side and drain region side (Comparative Example 2). The employed thin film transistor had a GOLD region whose length in the direction of the channel length is 1 μm, and the length of the LDD region in the direction of the channel length is 1 μm.

FIG. 27 represents the measured results of source-drain breakdown voltage. As shown in FIG. 27, it was confirmed that the thin film transistor of a GOLD structure according to the present embodiment can achieve a source-drain breakdown voltage higher than that of the thin film transistor of Comparative Example 1.It was also confirmed that the source-drain breakdown voltage of the thin film transistor of the present embodiment is substantially equal to that of the thin film transistor of Comparative Example 2.

FIG. 28 represents the dependency of the ratio of the source-drain breakdown voltage of the thin film transistor of the present embodiment to the source-drain breakdown voltage of the thin film transistor of Comparative Example 2 on the LDD length. As shown in FIG. 28, the source-drain breakdown voltage of the thin film transistor of the present embodiment is substantially equal to that of the thin film transistor of Comparative Example 2, regardless of the LDD length.

Figure 29:
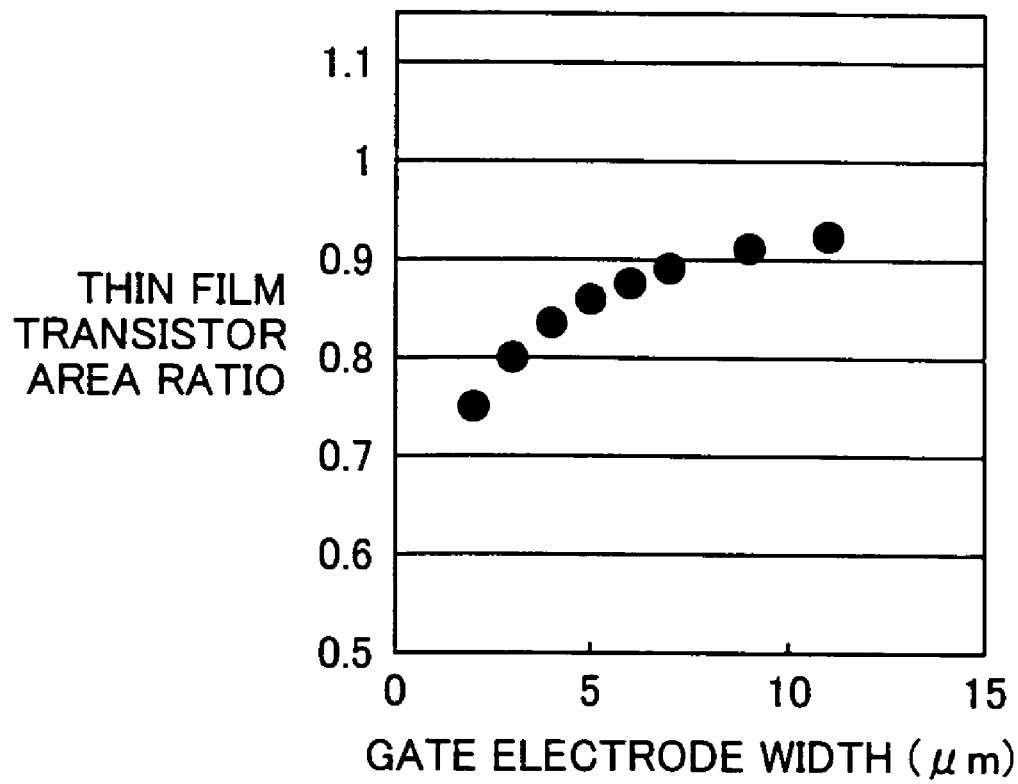
FIG. 29 is a graph representing the dependency of the thin film transistor area ratio on the gate electrode width in the second embodiment.

The occupying area of the thin film transistor will be described hereinafter. FIG. 29 is a graph representing the dependency of the area ratio of the occupying area of the thin film transistor of a GOLD structure according to the present embodiment to the occupying area of the thin film transistor of a conventional LDD structure on the gate electrode width. In the graph of FIG. 29, the area ratio of the vertical axis represents the area ratio (present embodiment/conventional case) set forth above.

According to the thin film transistor of the present embodiment, the occupying area can be reduced as compared to a conventional thin film transistor. Particularly when the gate electrode width becomes smaller in accordance with microminiaturization of the semiconductor device in the thin film transistor of the present embodiment, the effect of area reduction becomes more significant, as compared to a conventional thin film transistor.

It was found that the thin film transistor of the present embodiment can achieve a source-drain breakdown voltage and ON current higher than those of the thin film transistor of a conventional LDD structure. This means that the size can be reduced, which is advantageous in increasing and enhancing microminiaturization.

Third Embodiment

The above description is based on a thin film transistor having a GOLD region formed at both the source region side and the drain region side. The third embodiment is directed to a thin film transistor having a GOLD region formed only at the drain region side. First, a fabrication method thereof will be described.

Figure 30:
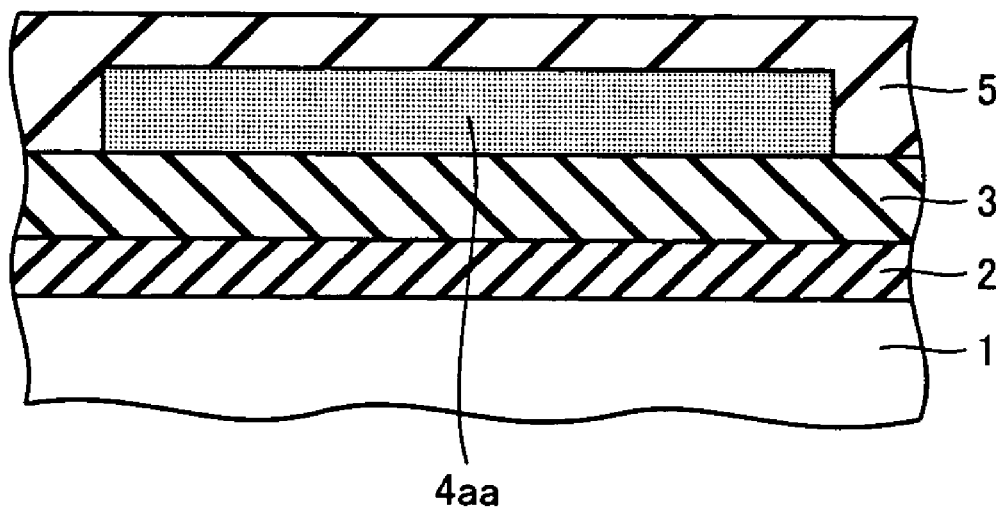
FIG. 30 is a sectional view of a semiconductor device according to a third embodiment of the present invention representing a step of a fabrication method thereof

A process similar to that corresponding to forming gate insulation film 5, as shown in FIG. 30, and implanting predetermined impurities directed to controlling the threshold value of the thin film transistor is similar to the process corresponding to the steps up to FIG. 4 set forth above.

Figure 31:
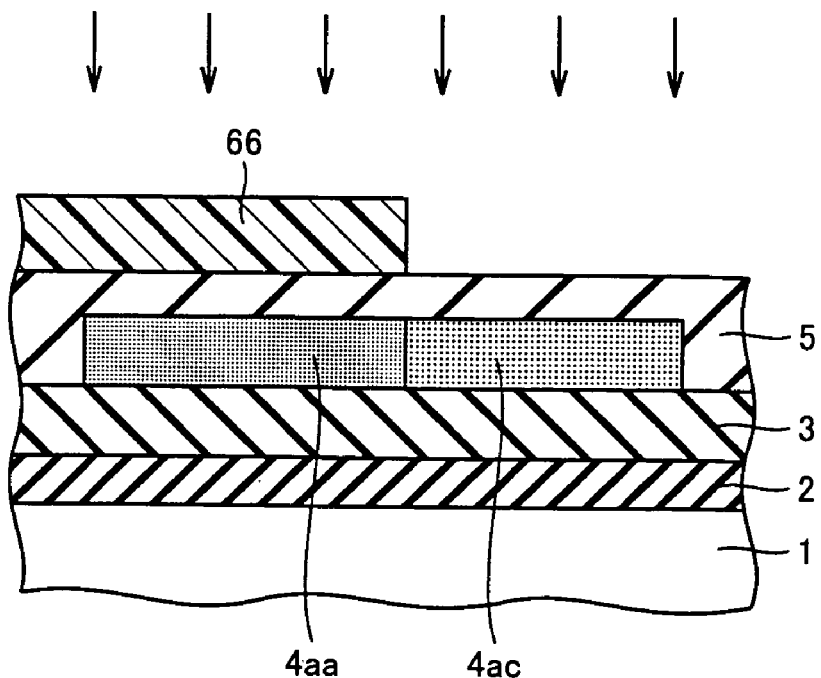
FIG. 31 is a sectional view of the semiconductor device of the third embodiment representing a step carried out after the step of FIG. 30.

Referring to FIG. 31, predetermined photolithography is applied to form a resist pattern 66 on gate insulation film 5. Using resist pattern 66 as a mask, phosphorus is implanted with a dosage of $5 \times 10^{12}$ atoms/cm$^2$ and acceleration energy of 80 KeV, for example, to obtain impurity region 4ac identified as the GOLD region. The implanted amount thereof corresponds to the amount of implantation in the GOLD region. Then, ashing and chemical treatment are applied to remove resist pattern 66.

Figure 32:
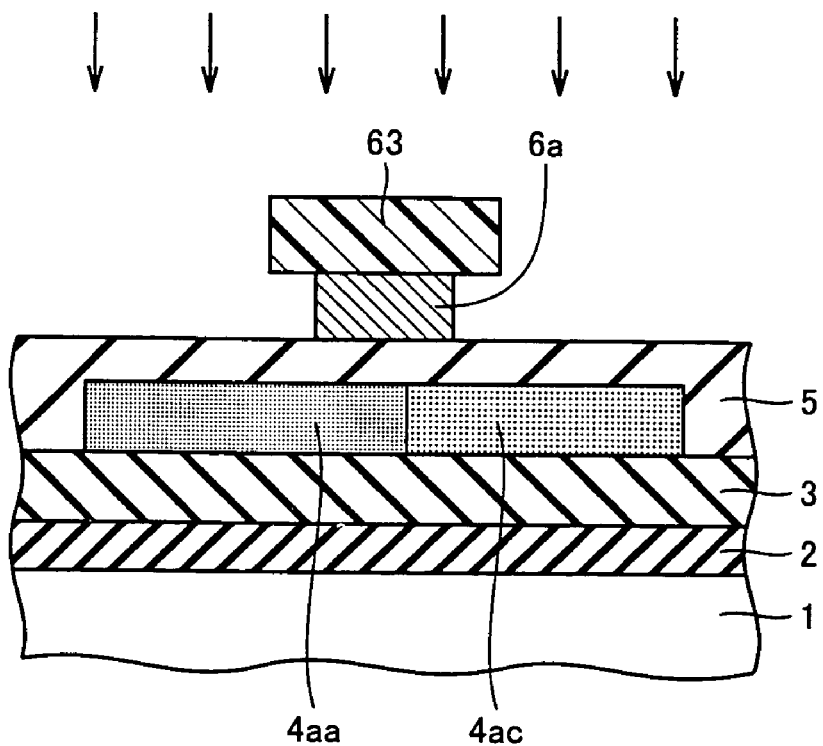
FIG. 32 is a sectional view of the semiconductor device of the third embodiment representing a step carried out after the step of FIG. 31.

Then, a chromium film (not shown) of approximately 400 nm in film thickness is formed all over gate insulation film 5 by sputtering. The chromium film is subjected to predetermined photolithography, whereby resist pattern 63 (refer to FIG. 32) is formed). Resist pattern 63 is formed so as to overlap with impurity region 4ac. The region overlapping with impurity region 4ac, particularly the region where the gate electrode that will formed afterwards overlaps with impurity 4ac, becomes the GOLD region. Referring to FIG. 32, using resist pattern 63 as a mask, the chromium film is subjected to wet etching, whereby gate electrode 6a is formed. Then, ashing and chemical treatment are applied to remove resist pattern 63.

Figure 33:
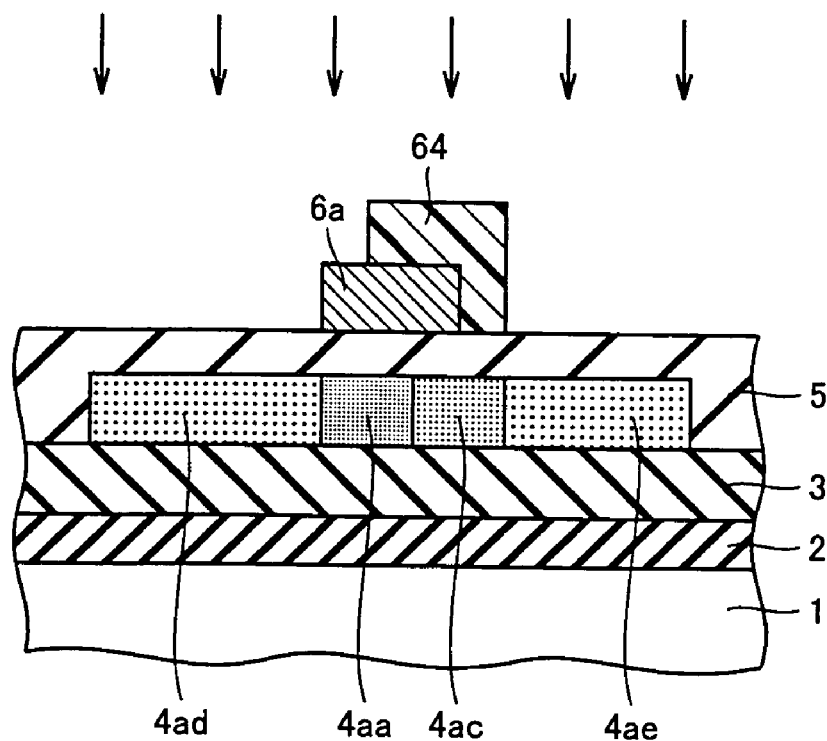
FIG. 33 is a sectional view of the semiconductor device of the third embodiment representing a step carried out after the step of FIG. 32.

Referring to FIG. 33, predetermined photolithography is applied to form resist pattern 64. Resist pattern 64 is formed to overlap with the region of the polycrystalline silicon film located at the drain region side (portion of impurity region 4ac), and not overlap with the region of the polycrystalline silicon film located at the source region side (portion of impurity region 4aa). The region of overlap between resist pattern 64 and the portion of impurity region 4ac corresponds to the LDD region. An LDD region will not be formed at the source region side since resist pattern 64 does not overlap with the portion of impurity region 4aa.

Using resist pattern 64 and gate electrode 6a as a mask, phosphorus is implanted with a dosage of $1 \times 10^{14}$ atoms/cm$^2$ and acceleration energy of 80 KeV, for example, to obtain impurity regions 4ad and 4ae identified as the source region and the drain region. Then, ashing and chemical treatment are applied to remove resist pattern 64.

Figure 34:
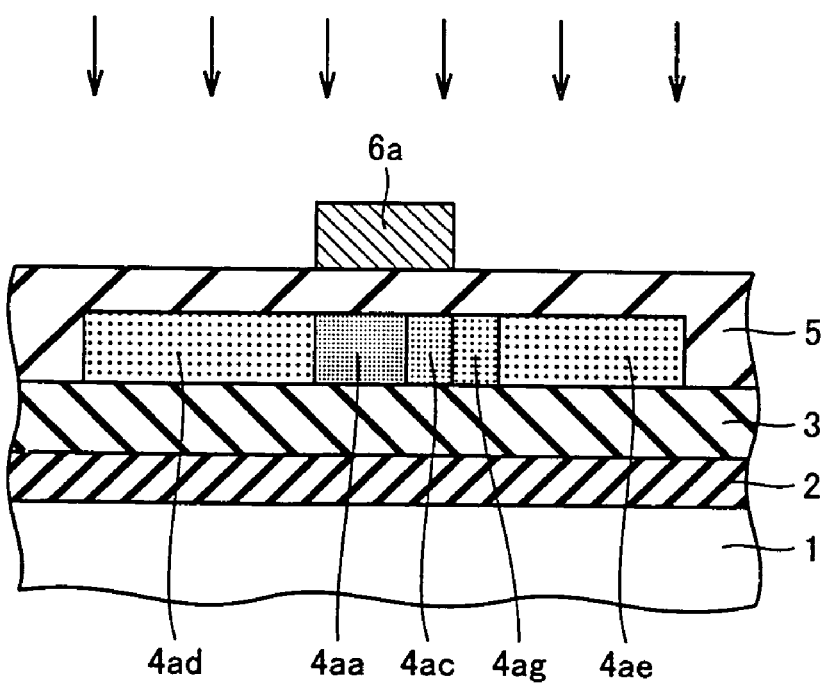
FIG. 34 is a sectional view of the semiconductor device of the third embodiment representing a step carried out after the step of FIG. 33.

Referring to FIG. 34, using gate electrode 6a as a mask, phosphorus is implanted with a dosage of $1 \times 10^{13}$ atoms/cm$^2$ and acceleration energy of 80 KeV, for example, to obtain impurity region 4ag identified as the LDD region at the remaining portion of impurity region 4ac. The impurity concentration of the impurity region 4ag identified as the LDD region depends upon the implanted amount of phosphorus, and the implanted amount directed to forming a GOLD region. In this case, the impurity concentration of the LDD region becomes lower than that of the GOLD region. Further, the impurity concentration of the LDD region and GOLD region becomes lower than the impurity concentration of the source region and the drain region.

Figure 35:
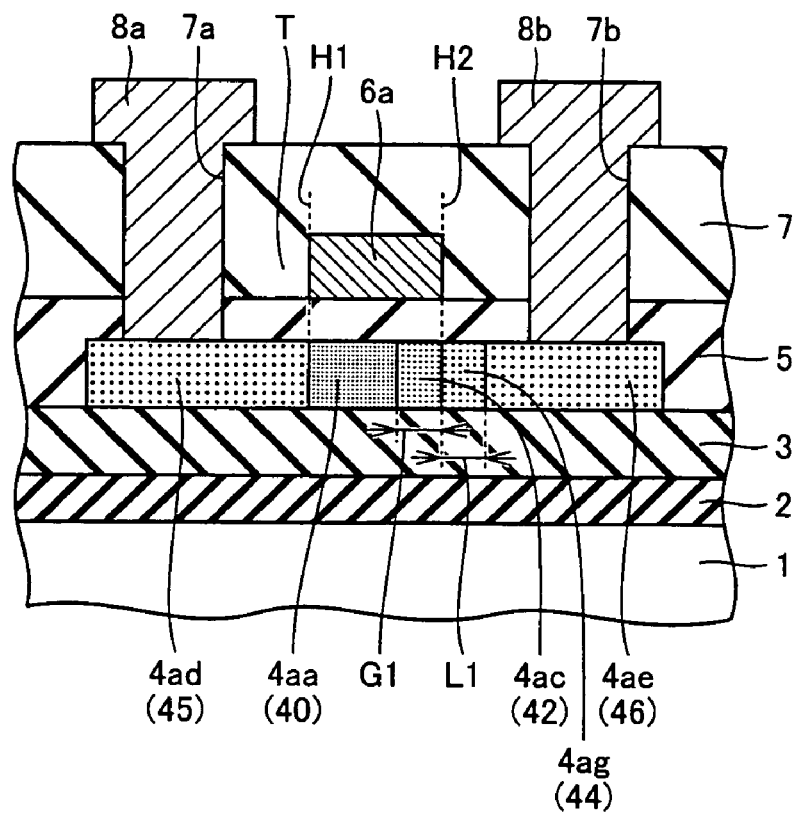
FIG. 35 is a sectional view of the semiconductor device of the third embodiment representing a step carried out after the step of FIG. 34.

Then, a step similar to the step of FIG. 9 set forth above is carried out, whereby an n channel thin film transistor T of a GOLD structure including GOLD region 42 and LDD region 44 only at the drain region 46 side, as shown in FIG. 35, is provided.

Electrical measurements on thin film transistor T set forth above were conducted. For measurement, a thin film transistor was employed with the following parameters: gate width 10 μm; gate width 10 μm; gate length 5 μm, length of GOLD region 42 in direction of channel length 1 μm; length of gate electrode in direction of channel length 7 μm; and length of LDD region 44 in direction of channel length varied from 0.5 to 4 μm.

The measured results of ON current will be first described. For measurement, the source was connected to ground. 8V and 5V were applied to the gate and drain, respectively. The drain current measured under such circumstances is taken as the ON current. For comparison, measurement was conducted also for a thin film transistor of a conventional LDD structure. This thin film transistor of a conventional LDD structure had the following parameters: gate width 10 μm; gate length 5 μm, and length of LDD region in direction of channel length 1 μm.

Figure 36:
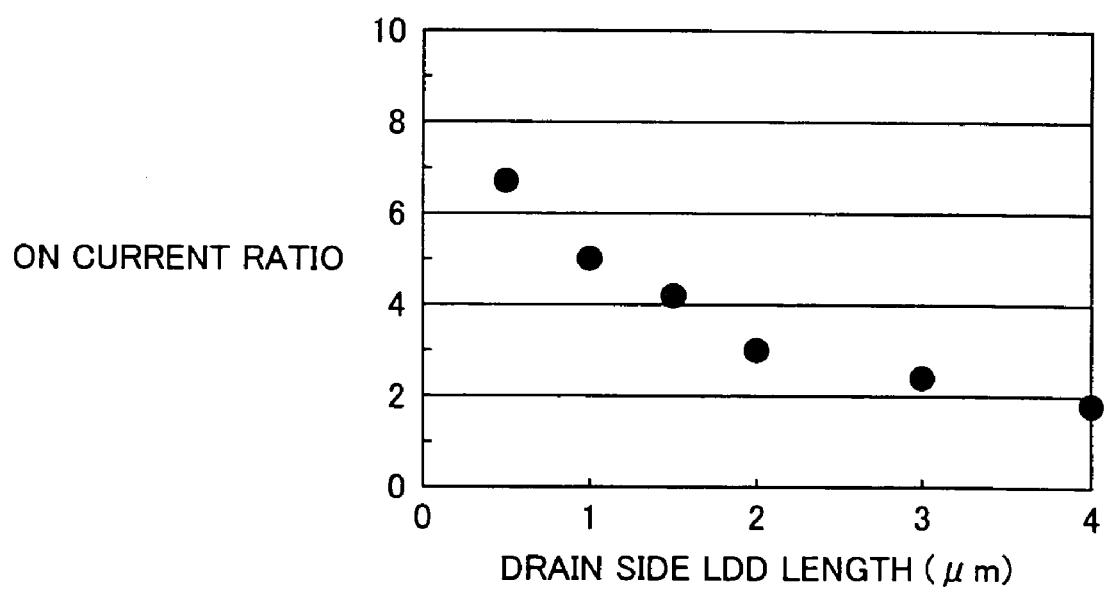
FIG. 36 is a graph representing the dependency of the thin film transistor ON current ratio on the LDD length in the third embodiment.

The measured results of the ON current are shown in FIG. 36. As shown in FIG. 36, it was confirmed that the ON current of the thin film transistor of the present embodiment is increased significantly than the ON current of the thin film transistor of a conventional LDD structure. Particularly, it was identified that the tendency of the ON current ratio becoming higher is more noticeable when the LDD length is not more than 2 μm. Therefore, the LDD length is preferably not more than 2 μm.

The measured results of source-drain breakdown voltage will-be described hereinafter. For the measurement, the gate voltage was set at 0V, and the source was connected to ground. The drain voltage when the drain current attains 0.1 μA is defined as the source-drain breakdown voltage. For the sake of comparison, measurement was conducted for a thin film transistor of a conventional LDD structure (Comparative Example 1), and a thin film transistor having an LDD region and a GOLD region at both the source region side and the drain region side. In the thin film transistors, the length of the GOLD region and the LDD region in the direction of the channel length were both set to 1 μm.

FIG. 37 represents the measurement results of source-drain breakdown voltage. As shown in FIG. 37, it was confirmed that the thin film transistor of the GOLD structure according to the present embodiment can exhibit a source-drain breakdown voltage higher than that of the thin film transistor of Comparative Example 1.It was also confirmed that the thin film transistor of the present embodiment exhibited a source-drain breakdown voltage substantially equal to that of the thin film transistor of Comparative Example 2.

FIG. 38 represents the dependency of the ratio of the source-drain breakdown voltage of the thin film transistor of the present invention to the source-drain breakdown voltage of the thin film transistor of Comparative Example 2 on the LDD length. As shown in FIG. 38, it was appreciated that the source-drain breakdown voltage of the thin film transistor of the present embodiment is substantially equal to the source-drain breakdown voltage of the thin film transistor of Comparative Example 2, regardless of the LDD length.

The occupying area of the thin film transistor will be described hereinafter. The graph of FIG. 39 represents the dependency of the area ratio of the occupying area of the thin film transistor of the GOLD structure according to the present embodiment to the occupying area of the thin film transistor of a conventional LDD structure on the gate electrode width. The area ratio of the vertical axis in the graph represents the area ratio (present embodiment/conventional case) set forth above.

As shown in FIG. 39, the thin film transistor of the present embodiment can have the occupying area reduced as compared to a conventional thin film transistor. It was appreciated that, when the gate electrode width becomes shorter in accordance with microminiaturization of the semiconductor device in the thin film transistor of the present embodiment, the advantage of area reduction becomes more significant as compared to a conventional thin film transistor.

It was appreciated that the thin film transistor of the present embodiment can exhibit a source-drain breakdown voltage and ON current higher than those of the thin film transistor of a conventional LDD structure, and also allowing further reduction in size.

The present embodiment has been described based on an example in which GOLD region 42 is provided only at the drain region 46 side. The GOLD region may be provided at either the source region 45 side or drain region 46 side. Further, the length of the GOLD region at the drain region 46 side may be set longer than the length of the GOLD region at the source region 45 side. In either case, a similar advantage can be achieved.

Fourth Embodiment

Figure 40:
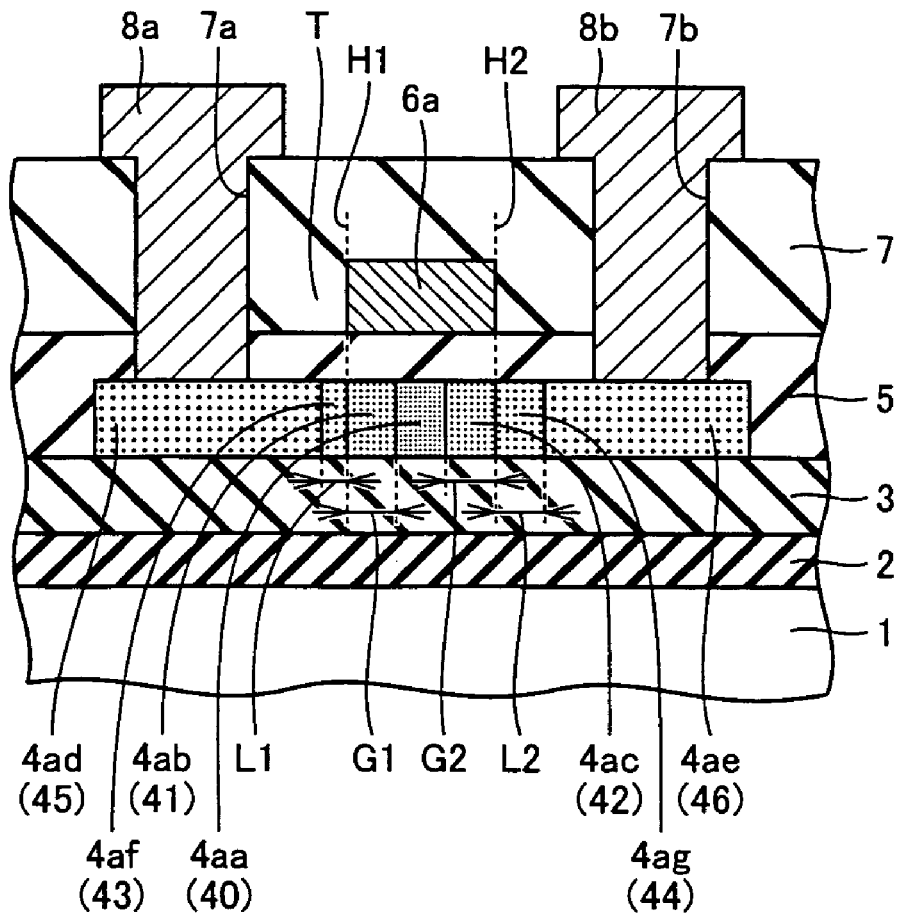
FIG. 40 is a sectional view of a semiconductor device according to a fourth embodiment of the present invention representing a step of a fabrication method thereof

The fourth embodiment is directed to a thin film transistor T having GOLD regions 41 and 42 and LDD regions 43 and 44 formed at both sides of source region side and the drain region side, as shown in FIG. 40. This thin film transistor has the length of the LDD region 44 in the direction of the channel length (LDD length) set longer than the length of the LDD region 43 in the direction of the channel length (LDD length). First, the fabrication method thereof will be described.

Figure 41:
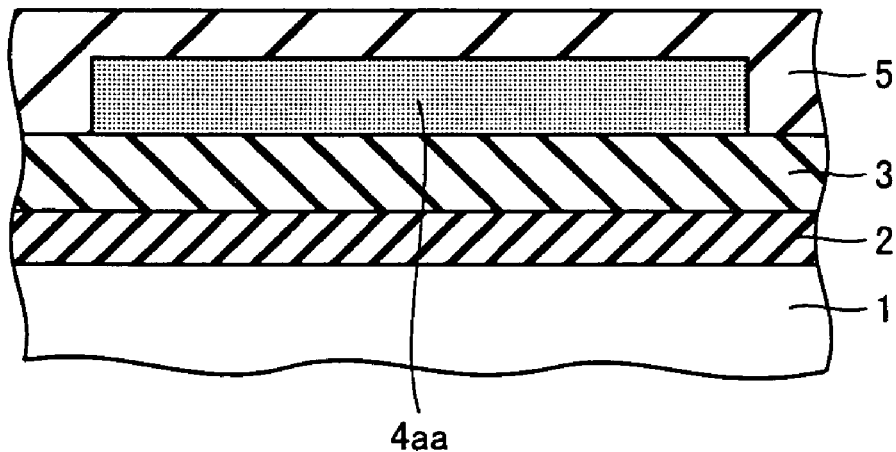
FIG. 41 is a sectional view of the semiconductor device of the fourth embodiment representing a step carried out after the step of FIG. 40.
Figure 42:
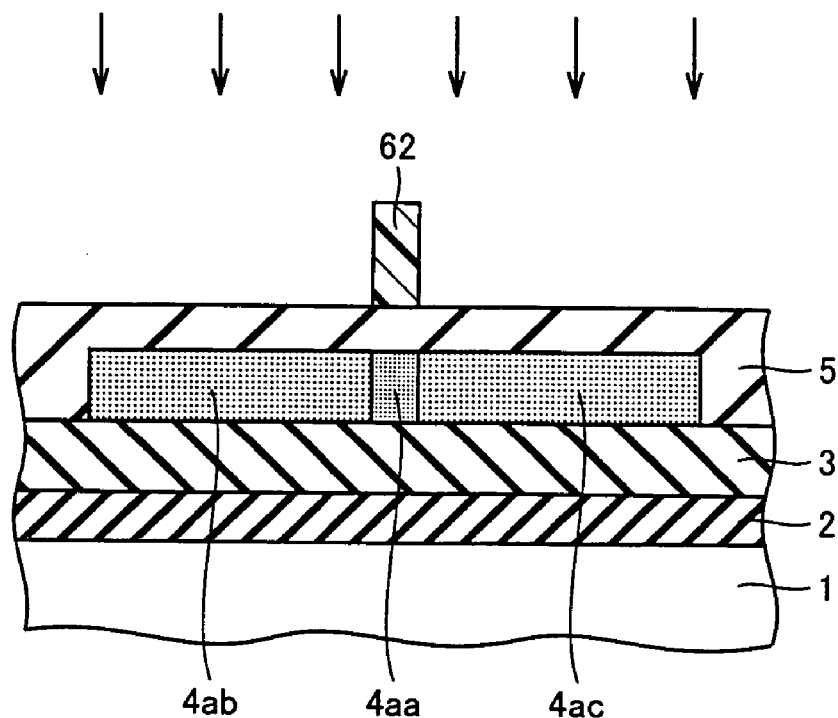
FIG. 42 is a sectional view of the semiconductor device of the fourth embodiment representing a step carried out after the step of FIG. 41.

The process of forming gate insulation film 5 shown in FIG. 41 and implanting predetermined impurities directed to controlling the threshold value of the thin film transistor is similar to the process corresponding to the steps up to FIG. 4 set forth above. Then, as shown in FIG. 42, predetermined photolithography is applied to form a resist pattern 62 on gate insulation film 5. Using resist pattern 62 as a mask, phosphorus is implanted with a dosage of $5 \times 10^{12}$ atoms/cm$^2$ and acceleration energy of 80 KeV, for example, to obtain impurity regions 4ab and 4ac identified as the GOLD region. The implanted amount thereof corresponds to the implantation amount at the GOLD region. Then, ashing and chemical treatment are applied to remove resist pattern 62.

Then, a chromium film (not shown) of approximately 400 nm in film thickness is formed all over gate insulation film 5 by sputtering. Predetermined photolithography is applied on the chromium film to form resist pattern 63 (refer to FIG. 43).

Figure 43:
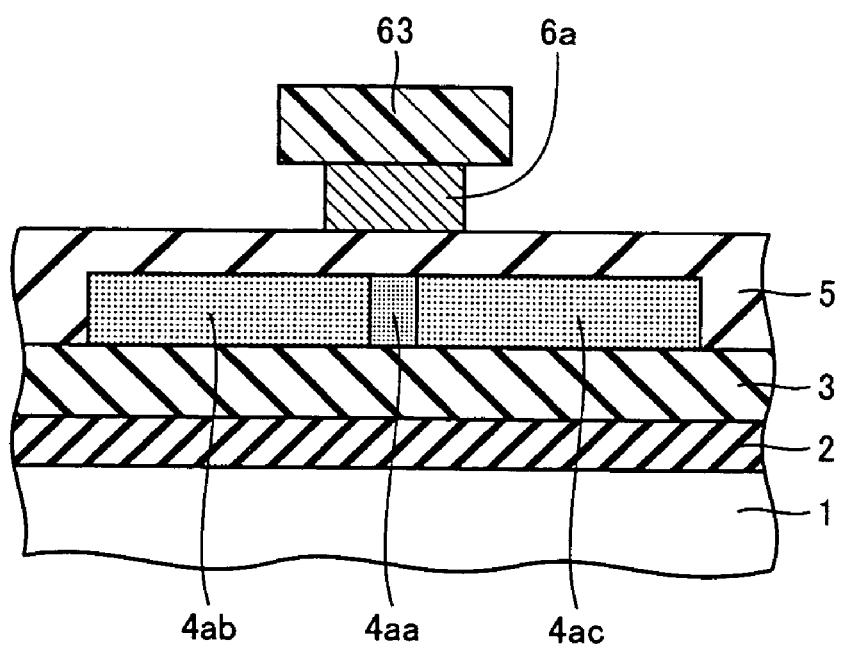
FIG. 43 is a sectional view of the semiconductor device of the fourth embodiment representing a step carried out after the step of FIG. 42.

Resist pattern 63 is formed so as to overlap with impurity regions 4ab and 4ac. The overlapping region with impurity regions 4ab and 4ac, particularly the region where the gate electrode that will be formed afterwards overlaps with impurity regions 4ab and 4ac, becomes the GOLD region. Referring to FIG. 43, using resist pattern 63 as a mask, the chromium film is subjected to wet etching to form gate electrode 6a. Then, ashing and chemical treatment are applied to remove resist pattern 63.

Figure 44:
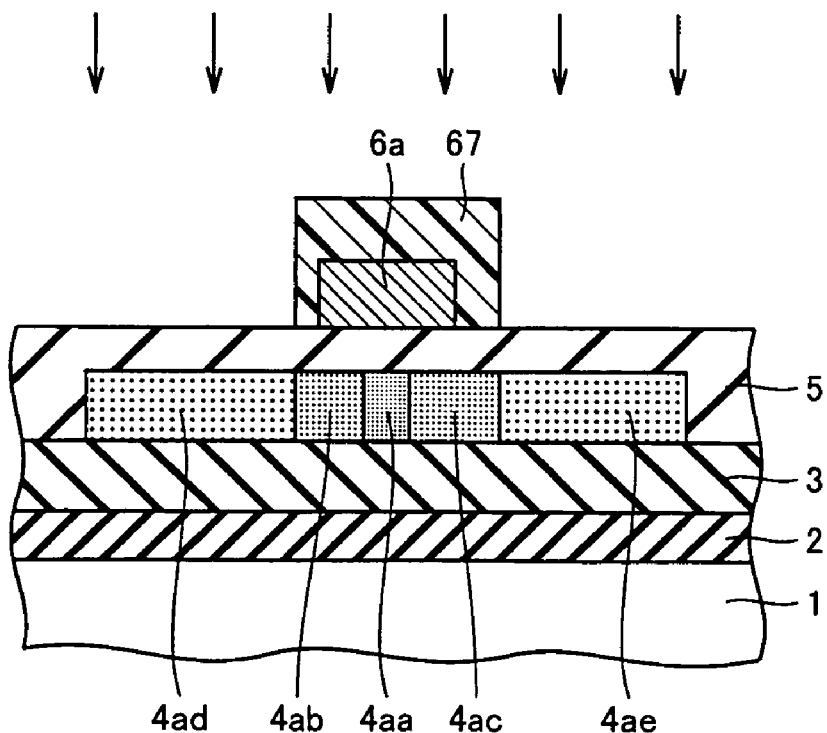
FIG. 44 is a sectional view of the semiconductor device of the fourth embodiment representing a step carried out after the step of FIG. 43.

Then, as shown in FIG. 44, predetermined photolithography is applied to form resist pattern 67. Resist pattern 67 is formed so as to overlap with the portion of the polycrystalline silicon film located at the source region side (portion of the impurity region 4ab), and overlapping with the portion of the polycrystalline silicon film located at the drain region side (portion of impurity region 4ac). The portion where resist pattern 67 and the portion of the impurity region 4ab overlap becomes the LDD region at the source region side, whereas the portion where resist pattern 67 and the portion of the impurity region 4ac overlap becomes the LDD region at the drain region side. Further, the LDD length of the LDD region at the drain region side is set to be longer than that of the LDD region at the source region side.

Using resist pattern 64 and gate electrode 6a as a mask, phosphorus is implanted with a dosage of 33 10$^{14}$ atoms/cm$^2$ and acceleration energy of 80 KeV, for example, to obtain impurity regions 4ad and 4ae identified as the source region and the drain region, respectively. Then, ashing and chemical treatment are applied to remove resist pattern 67.

Figure 45:
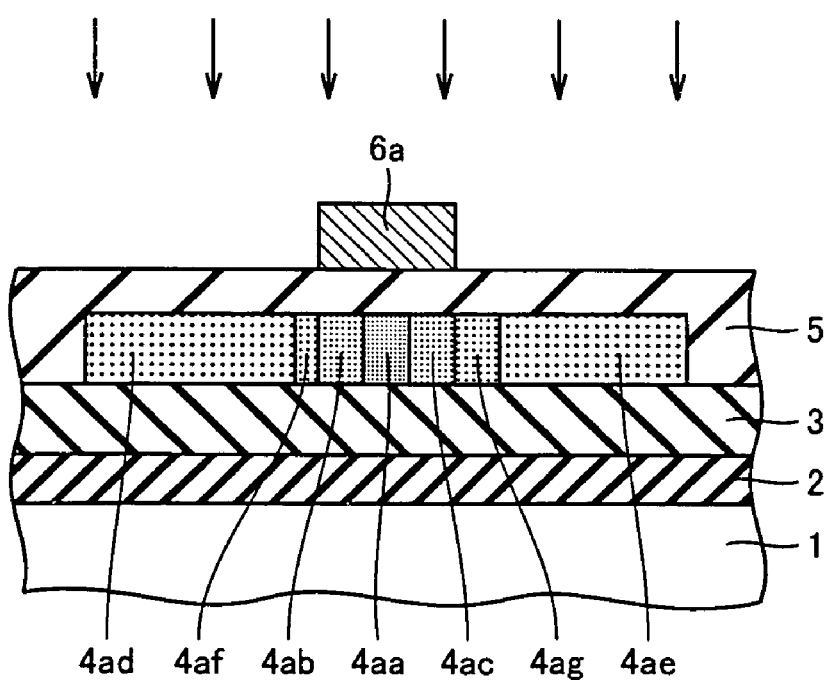
FIG. 45 is a sectional view of the semiconductor device of the fourth embodiment representing a step carried out after the step of FIG. 44.
Figure 46:
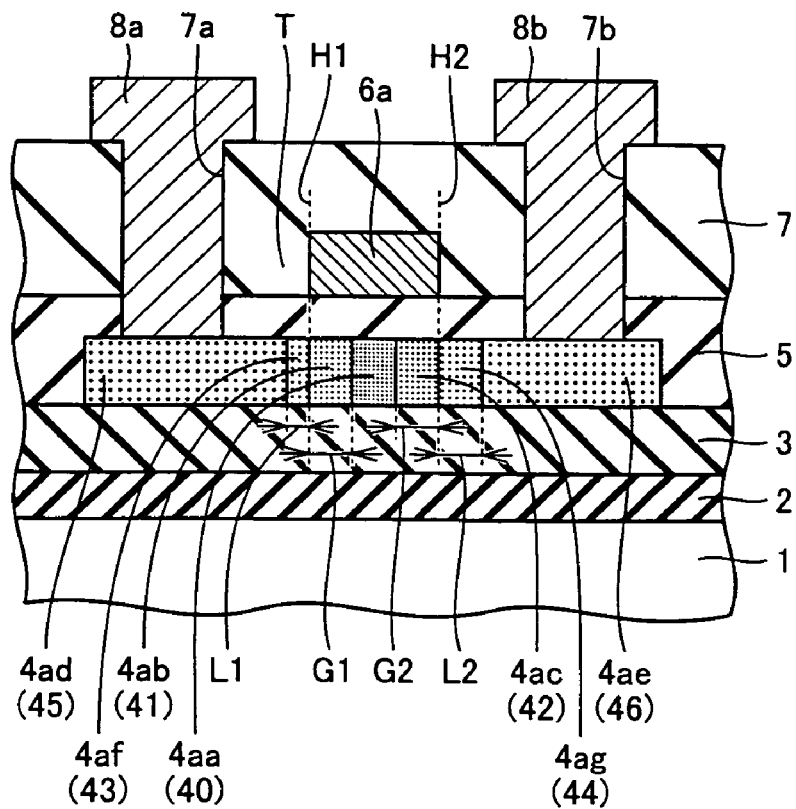
FIG. 46 is a sectional view of the semiconductor device of the fourth embodiment representing a step carried out after the step of FIG. 45.

Referring to FIG. 45, using gate electrode 6a as a mask, phosphorus is implanted with a dosage of $1 \times 10^{13}$ atoms/cm$^2$ and acceleration energy of 80 KeV, for example, to obtain impurity region 4af identified as the LDD region at the remaining portion of impurity region 4ab, and to obtain impurity region 4ag identified as the LDD region at the remaining portion of impurity region 4ac.

The impurity concentration of impurity regions 4af and 4ag identified as the LDD region is determined depending upon the implanted amount of phosphorus and the implantation amount for forming the GOLD region. In this case, the impurity concentration of the LDD region becomes higher than the impurity concentration of the GOLD region. Further, the impurity concentration of the LDD region and GOLD region becomes lower than the impurity concentration of the source region and drain region.

Then, a step similar to that of FIG. 9 set forth above is carried out. Thus, an n channel thin film transistor T of a GOLD structure including GOLD region 41 and LDD region 43 at the source region side 45 and GOLD region 42 and LDD region 44 at the drain region 46 side is formed. In this thin film transistor T, the LDD length of LDD region 44 is set longer than the LDD length of LDD region 43.

Electrical measurements were conducted on thin film transistor T set forth above. For the measurement, a thin film transistor was employed with the following parameters: gate width 10 μm; gate length 5 μm; length of GOLD region 42 in direction of channel length 1 μm; length of gate electrode in direction of channel length 7 μm; LDD length of LDD region 44 at drain region 46 side 1 μm; and LDD length of LDD region 43 at source region 45 side varied from 0 to 1 μm.

Measured results of ON current will be described hereinafter. For the measurement, the source was connected to ground, and 8V and 5V were applied to the gate and drain, respectively. The drain current measured under such circumstances is taken as the ON current. For comparison, measurement was conducted also on a thin film transistor of a conventional LDD structure. The conventional thin film transistor had the following parameters: gate width 10 μm; gate length 5 μm; and length of LDD region in direction of channel length 1 μm.

Figure 47:
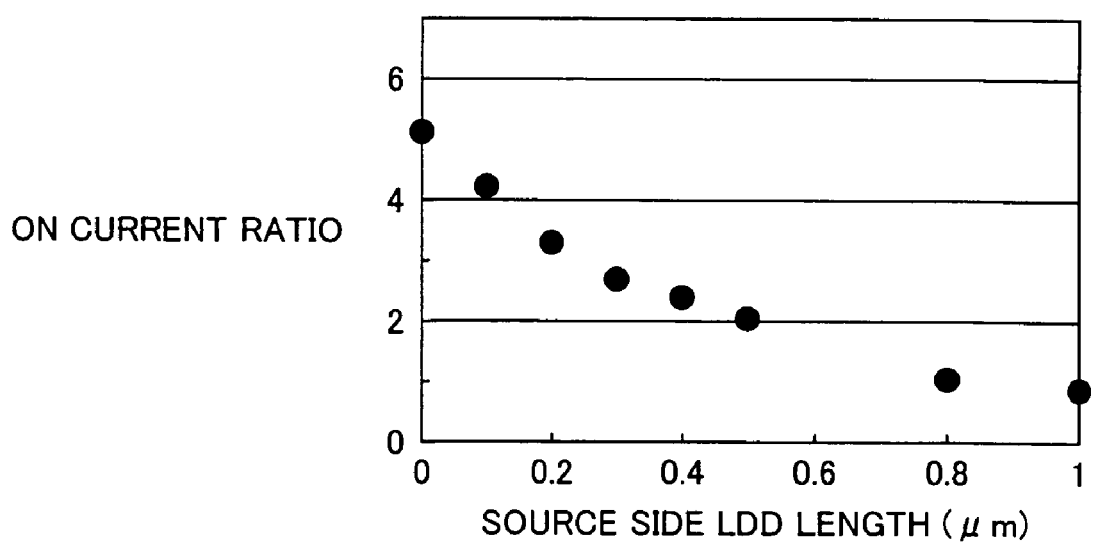
FIG. 47 is a graph representing the dependency of the thin film transistor ON current ratio on the LDD length at the source side in the fourth embodiment.

FIG. 47 represents the measured results of the dependency of the ON current on the LDD length of the LDD region (source region side). As shown in FIG. 47, it was confirmed that the ON current of the thin film transistor of the present embodiment was increased significantly as compared to that of a thin film transistor of a conventional LDD structure. Particularly, it was identified that the advantage of a larger ON current ratio is increased as the LDD length at the source region side is shorter, so that a shorter LDD length at the source region side is preferable.

FIG. 48 represents the measured results of the dependency of the ON current ratio on the LDD length when the LDD length of the LDD region at the source region side is set to 0.2 μm and the LDD length of the LDD region at the drain region side is varied. As shown in FIG. 48, it was identified that the tendency of the ON current ratio becoming higher is more noticeable when the LDD length is not more than 2 μm. Therefore, the LDD length of the LDD region at the drain region side is preferably not more than 2 μm.

The measured results of source-drain breakdown voltage will be described hereinafter. For the measurement, the gate voltage is set at 0V, and the source is connected to ground. The drain voltage when the drain current attains 0.1 μA is defined as the source-drain breakdown voltage. For comparison, measurement was conducted also for a thin film transistor of a conventional LDD structure (Comparative Example 1), and a thin film transistor having an LDD region and GOLD region at both the source region side and drain region side (Comparative Example 2). These thin film transistors had the length of the GOLD region and the LDD region in the direction of the channel length both set to 1 μm.

FIG. 49 represents the source-drain breakdown voltage measured results when the LDD length of the LDD region at the source region side of the thin film transistor of the present invention is set to 0.2 μm. As shown in FIG. 49, it was confirmed that the thin film transistor of a GOLD structure according to the present embodiment can exhibit a source-drain breakdown voltage higher than that of the thin film transistor of Comparative Example 1.Further, it was confirmed that the source-drain breakdown voltage of the thin film transistor of the present embodiment is substantially equal to that of the thin film transistor of Comparative Example 2.

FIG. 50 represents the dependency of the ratio of the source-drain breakdown voltage of the thin film transistor of the present embodiment to the source-drain breakdown voltage of the thin film transistor of Comparative Example 2 on the LDD length. It is appreciated from FIG. 50 that the source-drain breakdown voltage of the thin film transistor of the present embodiment is substantially equal to that of the thin film transistor of Comparative Example 2, regardless of the LDD length.

Figure 51:
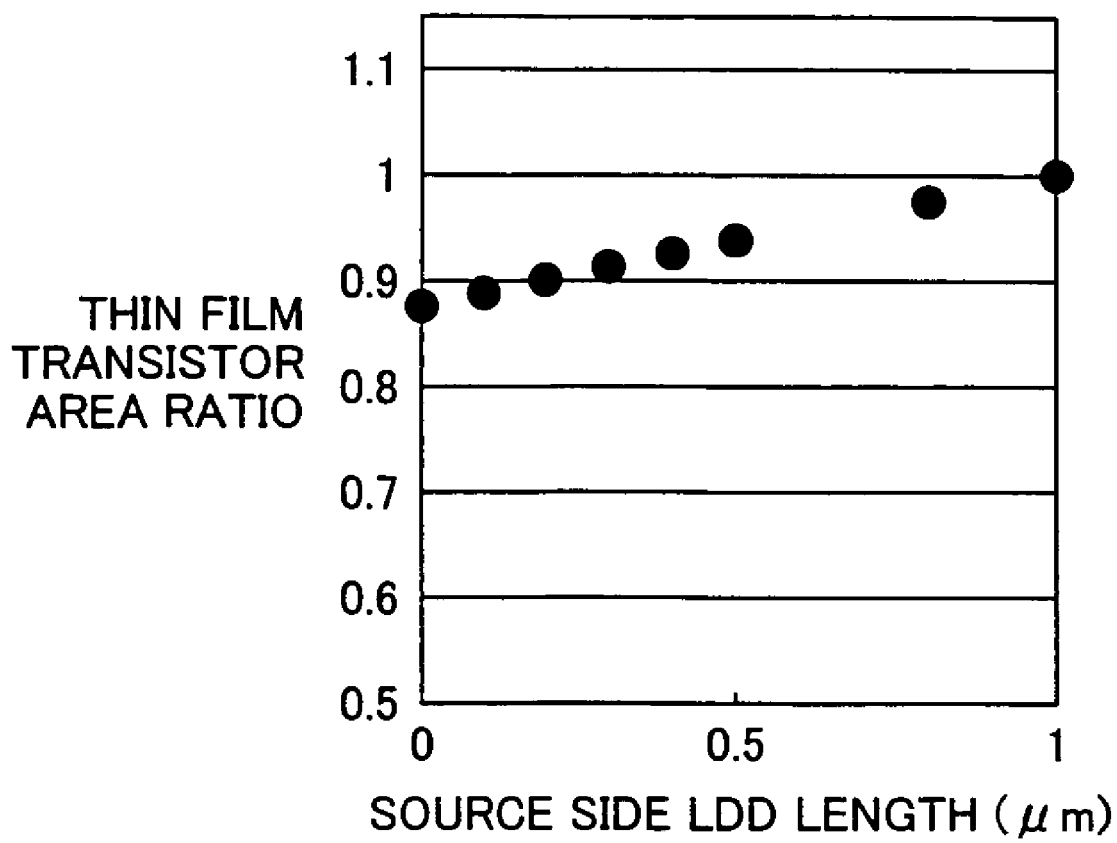
FIG. 51 is a graph representing the dependency of the thin film transistor area ratio on the LDD length at the source side in the fourth embodiment.

The occupying area of the thin film transistor will be described hereinafter. FIG. 51 is a graph representing the dependency of the area ratio of the occupying area of the thin film transistor of a GOLD structure according to the present embodiment to the occupying area of the thin film transistor of a conventional LDD structure on the gate electrode width. The area ratio corresponding to the vertical axis of the graph represents the area ratio (present embodiment/conventional case) set forth above. It is appreciated from FIG. 51 that the thin film transistor of the present embodiment has the occupying area reduced as compared to a conventional thin film transistor.

Fifth Embodiment

The thin film transistor of the present invention exhibits a high ON current and a high source-drain breakdown voltage when voltage is applied to the drain. When voltage is applied to the source, a low ON current and low source-drain breakdown voltage are exhibited. In view of these characteristics, a semiconductor device having desired operational characteristics can be obtained by appropriate combination of a thin film transistor of another structure.

Figure 52:
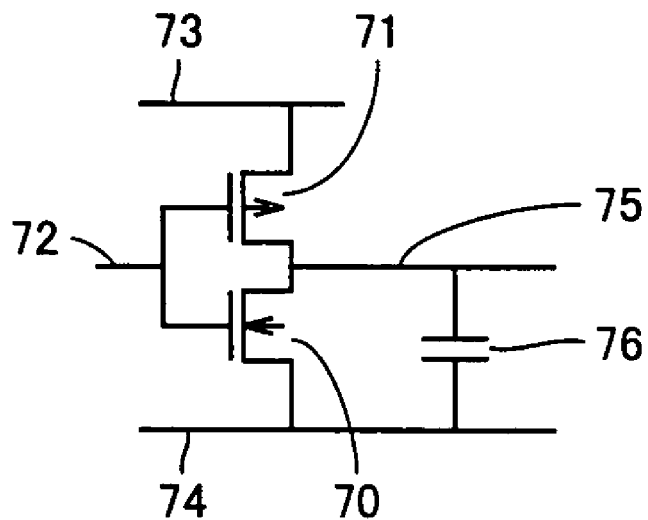
FIG. 52 represents an inverter circuit as an example of semiconductor device according to a fifth embodiment of the present invention.

For example, application of the thin film transistor of the present invention to an inverter circuit allows improvement in performance. FIG. 52 is a diagram of an inverter circuit to which an n channel thin film transistor 70 and a p channel thin film transistor 71 are applied. N channel thin film transistor 70 corresponds to the thin film transistor of the embodiments of the present invention set forth above. N channel thin film transistor 70 is formed such that drain region 46 (refer to FIG. 1) is connected to an output gate 75. A conventional thin film transistor is employed for p channel thin film transistor 71.

When the inverter circuit operates to receive a signal of a low level at input gate 72, n channel thin film transistor 70 is turned OFF whereas p channel thin film transistor 71 is turned ON. Accordingly, power supply voltage is applied to load capacitance 76 through a power supply line 73 to be charged. A signal of a high level is output at the output gate 75 side.

When a signal of a high level is applied to input gate 72 of the inverter, n channel thin film transistor 70 is turned ON whereas p channel thin film transistor 71 is turned OFF. Accordingly, load capacitance 26 will be discharged. In other words, a signal of a low level will be output at the output gate 75 side.

By employing a thin film transistor of the embodiments set forth above as n channel thin film transistor 70, a high ON current can be achieved. The time of the output signal falling from a high level to a low level (discharging time) becomes shorter as the ON current is higher. Therefore, in a semiconductor device with such an inverter circuit, favorable operating characteristics can be achieved by virtue of the short falling time of output gate 75. In the operation of the inverter circuit, the power supply voltage of power supply line 73 is applied only to the output gate 75 side (the drain region side of n channel thin film transistor 70).

It is known that when voltage is applied across the source and drain in a thin film transistor, degradation caused by hot carriers will occur. Particularly, deterioration caused by the drain avalanche hot carriers (DAHC) generated at an operating region where the gate voltage is low is of concern. The DAHC is accelerated by the high electric field at the drain end. It is to be noted that the thin film transistor of the present embodiment has the electric field at the drain end alleviated by the provision of the GOLD region and LDD region at the drain region side. Therefore, generation of DAHC can be suppressed to allow higher reliability. Further, occurrence of impact ionization is suppressed to allow favorable source-drain breakdown voltage and reliability.

Figure 53:
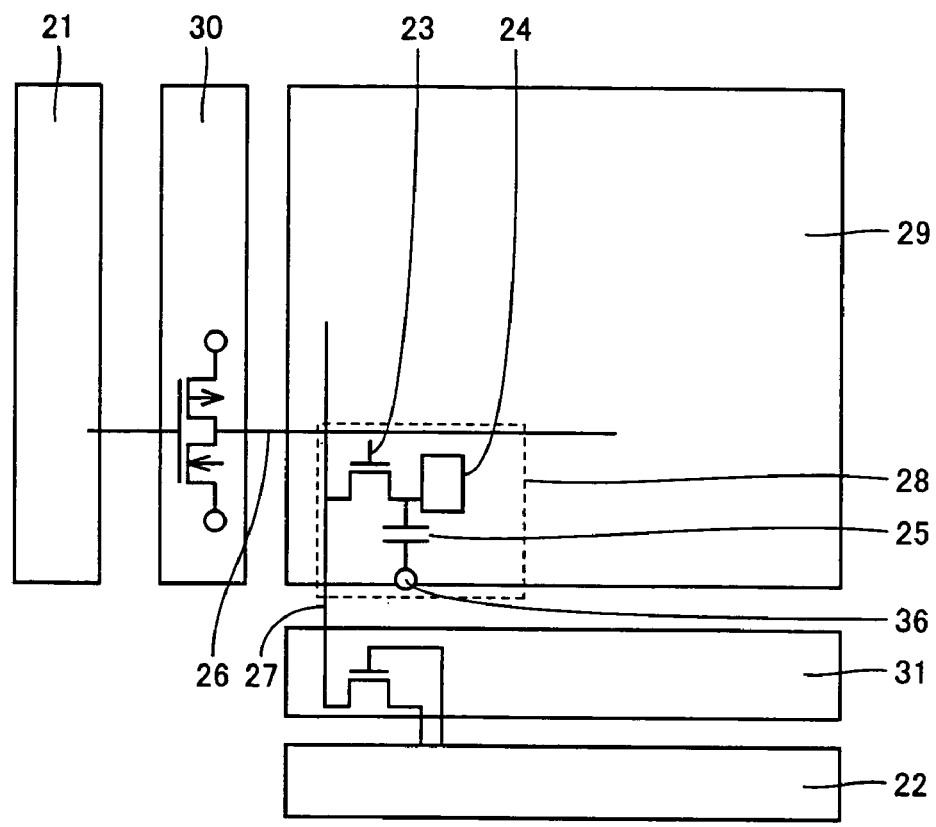
FIG. 53 is a block diagram of a configuration of a liquid crystal display device according to the fifth embodiment.

The above-described characteristics of a thin film transistor are particularly effective when the load of the next stage is high. For example, the thin film transistor of the present invention can be applied to the gate driver of a liquid crystal display device. Referring to FIG. 53, a liquid crystal display device includes a pixel region 29 formed of a plurality of pixels 28 to display an image, and a scanning line driving circuit unit 21 and a data line driving circuit unit 22 to control the operation of a pixel region thin film transistor 23 provided at each of the plurality of pixels 28. An output buffer 30 is provided between scanning line driving circuit unit 21 and pixel region 29. Further, an analog switch 31 is provided between data line driving circuit unit 22 and pixel region 29.

Pixels 28 are arranged in an array at pixel region 29. A pixel thin film transistor 23, a pixel electrode 24, and a storage capacitance 25 constitute one pixel 28. In pixel 28, liquid crystal (not shown) is filled between pixel electrode 24 and a counter electrode (not shown) to form a pixel capacitance (not shown). The voltage applied to the crystal is determined by the voltage applied across pixel electrode 24 and the counter electrode. The liquid crystal alignment status is altered by the voltage applied to the liquid crystal, whereby the intensity of light transmitted through the liquid crystal is controlled. Storage capacitance 25 is formed between pixel region thin film transistor 23 and a common electrode 36.

Pixels 28 arranged in an array are connected to a data line 27 that is connected to analog switch 31 and data line driving circuit unit 22, and to a scanning line 26 that is connected to output buffer 30 and scanning line driving circuit unit 21. A pixel signal is output from data line driving circuit unit 22. The output pixel signal is sent to pixel 28 with the timing of transmission to data line 27 controlled by analog switch 31. A pixel select signal is output from scanning line driving circuit unit 21. The output pixel select signal is delivered to pixel 28 from output buffer 30 via scanning line 26.

In this liquid crystal display device, the inverter set forth above is employed for output buffer 30. Pixel thin film transistor 23 has its gate connected to scanning line 26 to be controlled by a signal input through scanning line 26. When the gate of pixel thin film transistor 23 is turned ON, the pixel signal sent from data line 27 is stored at the pixel capacitance and storage capacitance to be maintained even after the gate has been turned OFF. Therefore, the liquid crystal has voltage applied across pixel electrode 24 and the counter electrode (not shown) to allow control of the transmittance.

The signal applied onto scanning line 26 is output by output buffer 30. The load capacitance thereof takes an extremely high value since it corresponds to the sum of the gate capacitance of pixel thin film transistor 23 connected to scanning line 26 and storage capacitance 25. By employing the inverter of the present invention for output buffer 30, the large load capacitance can be charged in a short period of time.

The thin film transistor employed for the inverter may be a thin film transistor of either the n channel type or p channel type described in the embodiments set forth above. A similar effect can be achieved in either case.

By virtue of the characteristics of the thin film transistors set forth above in respective embodiments of the present invention, the desired advantage can be achieved by employing the thin film transistor described in respect to embodiments as pixel thin film transistor 23 of FIG. 53. This pixel thin film transistor 23 has its source connected to data line 27 and its drain connected to pixel electrode 24.

Although the liquid crystal has the transmittance altered according to the absolute value of the voltage applied across pixel electrode 24 and the counter electrode (not shown), this operation does not depend upon the voltage polarity. In view of the image persistant phenomenon occurring when DC voltage component is applied to the liquid crystal, the image signal applied to the liquid crystal has its polarity inverted for every frame.

Figure 54:
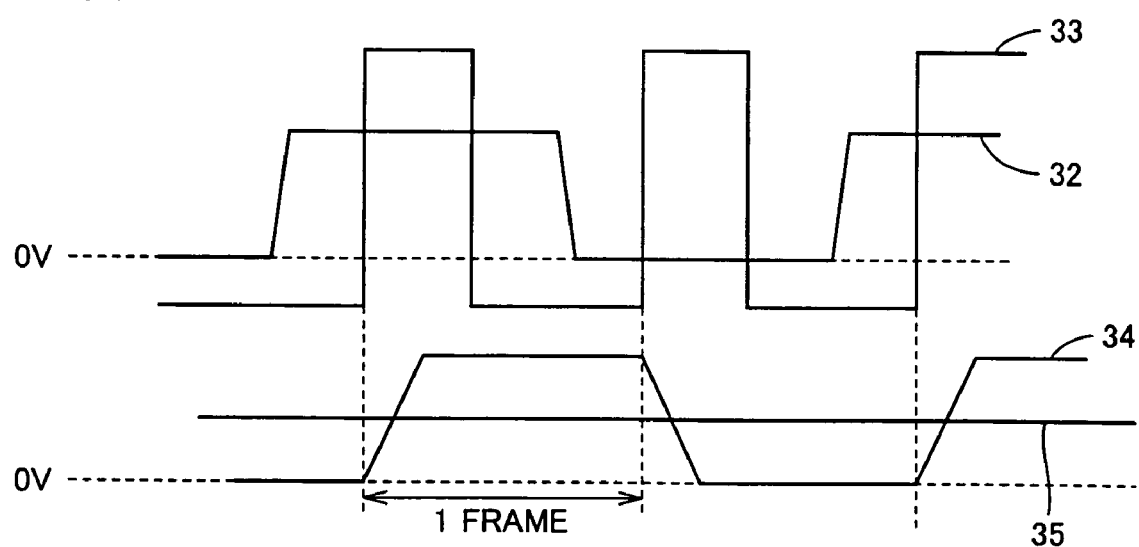
FIG. 54 is a graph representing change in image signals and the like in the liquid crystal display device of the fifth embodiment.

This is shown in FIG. 54. Common voltage 35 is applied to the counter electrode. Image signal 32 has its polarity inverted for every frame with respect to the common voltage. When an image signal 32 of positive polarity is to be written into pixel 28, image signal 32 is first applied onto data line 27. Then, select signal 33 is applied onto scanning line 26. Thin film transistor 23 is turned ON, whereby the pixel capacitance and storage capacitance are charged. At this stage, the voltage applied to the drain of pixel thin film transistor 23 is higher than the voltage applied to the source. Since the voltage at the source side becomes higher as the charging to the pixel capacitance and storage capacitance advances, the voltage across the source and gate is reduced.

When pixels signal 32 of negative polarity is to be written into pixel 28, image signal 32 is first applied onto data line 27. Then, select signal 33 is applied onto scanning line 26. Pixel thin film transistor 23 is turned ON, whereby the pixel capacitance and storage capacitance are discharged. Accordingly, pixel voltage 34 attains the voltage level of image signal 32. At this stage, a voltage lower than that to the source is applied to the drain of pixel thin film transistor 23. Since the voltage at the drain side is constant even though the discharging from the pixel capacitance and storage capacitance continues, the voltage across the drain and gate is constant.

Thus, the voltage across the source and gate is reduced when the polarity of image signal 32 is positive, whereas the voltage across the drain and gate is constant when the polarity of image signal 32 is negative. Therefore, the time required to write image signal 32 becomes longer when the polarity of image signal 32 is positive as compared to the case when the polarity of image signal 32 is negative. The design value corresponding to the time required for writing is rate-determined by the time required for writing when the polarity is positive.

When select signal 33 falls and pixel thin film transistor 23 falls, the gate voltage becomes negative with respect to the source-drain voltage. Therefore, degradation caused by AC stress occurs. Since the source and drain are at the same potential level at this stage, the degree of deterioration is equal between the source and drain. By this AC stress deterioration, the writing rate by pixel thin film transistor 23 will be reduced. At the time of writing image signal 32 of positive polarity that rate-determines the time required for writing, the voltage of the source becomes higher with respect to the drain. Therefore, degradation at the drain side will cause a greater effect on degradation in the time required for writing.

In the liquid crystal display device of the present invention, the electric field at the drain end is alleviated by virtue of the provision of the GOLD region and LDD region at the drain side in pixel thin film transistor 23. This means that degradation at the drain can be reduced to prevent reduction in the writing rate. Additionally, the size of the thin film transistor can be further reduced, as compared to a thin film transistor having the LDD region provided at both sides of the source and drain.

A thin film transistor of either the n channel type or p channel type described in the embodiments set forth above can be employed for pixel thin film transistor 23. A similar advantage can be provided for either case.

The thin film transistor described in the embodiments set forth above can also be employed in an analog switch 31 of FIG. 53. An n channel thin film transistor is employed for analog switch 31. The n channel thin film transistor has its drain connected to data line 27 and its source connected to data line driving circuit 22. The operation of this thin film transistor is similar to that of pixel thin film transistor 23. The load capacitance thereof will take a large value since it corresponds to the sum of the total of the gate capacitance of pixel thin film transistor 23 and the parasitic capacitance of data line 27. Therefore, by employing the thin film transistor described in respective embodiments set forth above, the large load capacitance can be charged in a short period of time.

Figure 55:
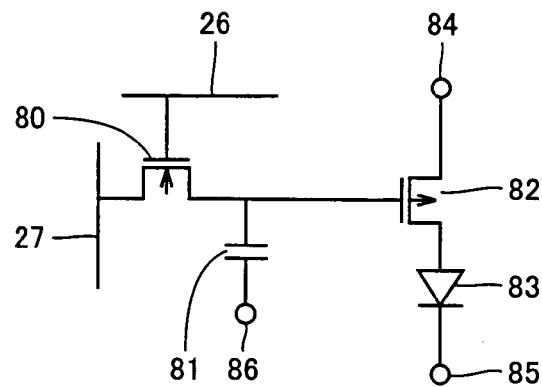
FIG. 55 represents a pixel circuit of an organic EL display device of the fifth embodiment.

The thin film transistor described in respective embodiments set forth above can also be employed for a switching transistor of an organic EL display device qualified as an image display device. In the pixel circuitry of the organic EL display device shown in FIG. 55, an n channel thin film transistor is employed for a switching transistor 80. Switching transistor 80 has its drain connected to storage capacitance 81 and the gate of driving transistor 82, and its source connected to data line 27. Storage capacitance 81 has its other end connected to capacitor line 86.

When a pixel signal is to be written into a pixel, the pixel signal is first applied onto data line 27. Then, the select signal is applied onto scanning line 26, and switching transistor 80 is turned ON. Accordingly, storage capacitance 81 is charged. The charge in storage capacitance 81 is maintained even when a deselect signal is applied to turn OFF switching transistor 80. Further, since the voltage applied to the gate of driving transistor 82 changes by the charge in storage capacitor 81, the current flowing to organic EL device 83 can be controlled.

In this case, storage capacitance 81 and the gate capacitance of driving transistor 82 become the load capacitance. In an organic EL, the data signal corresponds to only a signal of positive polarity, differing from that of the pixel circuit of liquid crystal. However, the storage capacitance must be discharged when organic EL device 83 is to be reset between frames. The organic EL operates in a manner similar to that of liquid crystal display device in this issue. By employing a thin film transistor of respective embodiments set forth above as the switching transistor, an advantage similar to that of the liquid crystal display device can be achieved.

Figure 56:
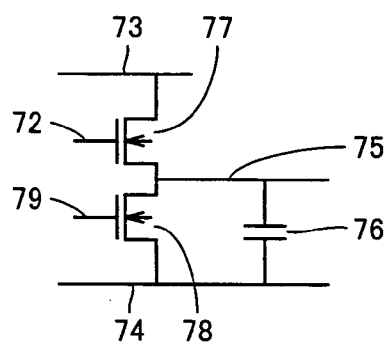
FIG. 56 represents an amplifier circuit of the fifth embodiment.

Further, the characteristics of the thin film transistor of respective embodiments set forth above are advantageous for circuits that conduct current in one direction. For example, the thin film transistor of the present invention can be applied to an amplifier circuit. FIG. 56 shows an amplifier circuit including a power supply line 73, a ground line 74, an n channel thin film transistor 77 with an input gate 72, an n channel thin film transistor 78 with a gate 79 of a constant current source, an output gate 75, and load capacitance 76. N channel thin film transistor 78 has constant voltage applied to gate 79 to operate as a direct current power supply.

In n channel thin film transistor 77, the impedance changes in response to the signal applied to input gate 72. Therefore, the voltage drop at n channel thin film transistor 77 is controlled by the gate voltage, allowing control of the output voltage. N channel thin film transistors 77 and 78 constituting the amplifier are configured such that voltage is always applied to the drain side. In the thin film transistor described in respective embodiments of the present invention employed as the n channel thin film transistor, the electric field at the drain end is alleviated by the provision of the GOLD region and LDD region at the drain side. Therefore, generation of DAHC can be suppressed to allow an amplifier of higher reliability. Although an n channel thin film transistor is described as being employed as the thin film transistor for this amplifier, a similar effect can be obtained by employing a p channel thin film transistor.

Since the thin film transistor according to respective embodiments set forth above is effective for circuits that conduct current in one direction, the thin film transistor of the present invention can be applied to an organic EL pixel circuit. In the organic EL pixel circuit shown in FIG. 55, a p channel thin film transistor according to respective embodiments set forth above is employed as thin film transistor 82 for driving. Thin film transistor 82 has its source connected to power supply line 84 and its drain connected to organic EL device 83. Organic EL device 83 has its other end connected to a cathode 85. Drive transistor 82 is configured to always have a negative voltage applied to the drain side.

In the thin film transistor of the present invention employed as driving thin film transistor 82, a GOLD region and an LDD region are formed at the drain side. Accordingly, the electric field at the drain end is alleviated to suppress generation of DAHC. Therefore, high reliability for the organic EL display device can be achieved. Although a p channel thin film transistor is taken as an example of the organic EL driving thin film transistor, a similar advantage can be achieved even when an n channel thin film transistor is applied.

Figure 57:
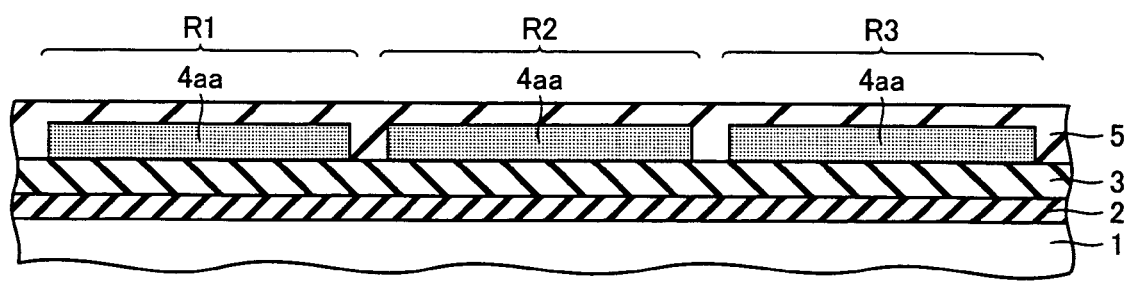
FIG. 57 is a sectional view of the semiconductor device of the fifth embodiment representing a step of a fabrication method thereof

An example of a fabrication method of thin film transistors of different types will be described hereinafter. In accordance with a method similar to that described in the first embodiment, a silicon nitride film 2 and a silicon oxide film 3 are formed on a glass substrate 1, as shown in FIG. 57. On silicon oxide film 3 located at predetermined regions R1-R3 where the thin film transistor is formed on substrate 1, island-shaped polycrystalline silicon films are formed. Thin film transistors of different types are formed at regions R1-R3.

Gate insulation film 5 formed of a silicon oxide film is provided so as to cover the polycrystalline silicon film. For the purpose of controlling the threshold value of the thin film transistor, boron is implanted into the polycrystalline silicon film with a dosage of $1 \times 10^{12}$ atoms/cm$^2$ and acceleration energy of 60 KeV, for example, to obtain island-shape impurity region 4aa.

Figure 58:
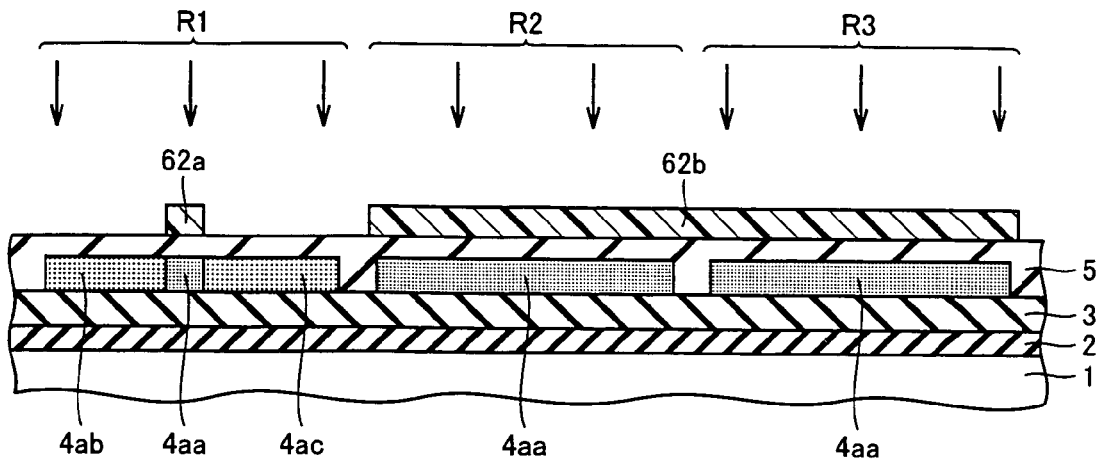
FIG. 58 is a sectional view of the semiconductor device of the fifth embodiment representing a step carried out after the step of FIG. 57

Referring to FIG. 58, predetermined photolithography is applied to form resist pattern 62a directed to formation of an n channel thin film transistor of a GOLD structure at region R1, and to form resist pattern 62b at region R2 and region R3 where an n channel thin film transistor of an LDD structure and a general p channel thin film transistor are formed, respectively. Resist pattern 62b is formed to cover regions R2 and R3.

Using resist patterns 62a and 62b as a mask, phosphorus is implanted with a dosage of $5 \times 10^{12}$ atoms/cm$^2$ and acceleration energy of 80 KeV, for example, into impurity region 4aa to obtain impurity regions 4ab and 4ac at region R1. The implanted amount thereof corresponds to the implantation amount at the GOLD region. Then, ashing and chemical treatment are applied to remove resist patterns 62a and 62b.

Then, a chromium film (not shown) of approximately 400 nm in thickness is formed all over gate insulation film 5 by sputtering. Then, predetermined photolithography is applied to form resist pattern 63b directed to patterning a gate electrode at region R3, and to form a resist pattern 63a at regions R1 and R2. Resist pattern 63a covers regions R1 and R2 (refer to FIG. 59).

Figure 59:
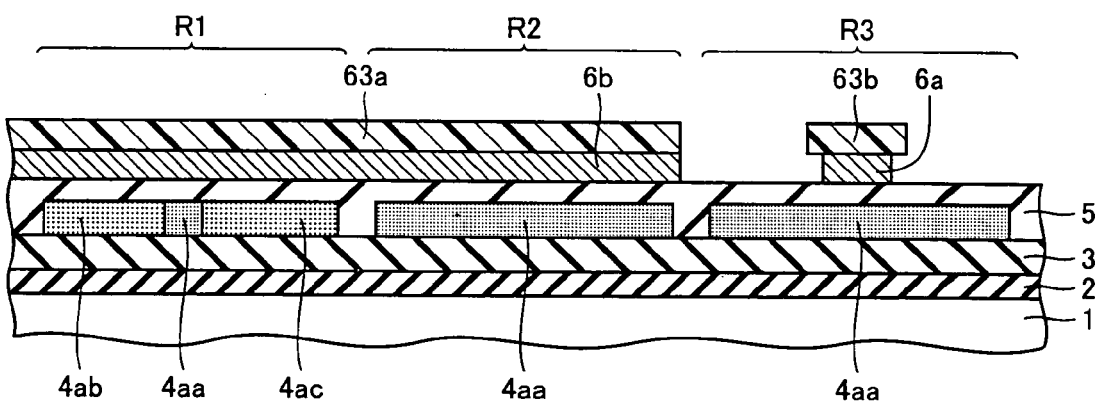
FIG. 59 is a sectional view of the semiconductor device of the fifth embodiment representing a step carried out after the step of FIG. 58.

Referring to FIG. 59, using resist patterns 63a and 63b as a mask, the chromium film is subjected to wet etching to form gate electrode 6a at region R3. At regions R1 and R2, chromium film 6b thereon remains. Then, ashing and chemical treatment are applied to remove resist patterns 63a and 63b.

Figure 60:
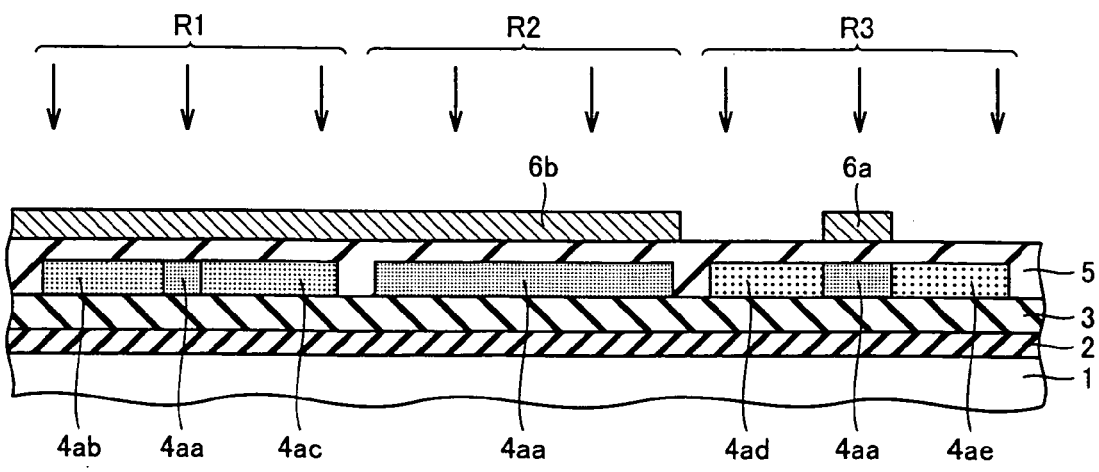
FIG. 60 is a sectional view of the semiconductor device of the fifth embodiment representing a step carried out after the step of FIG. 59.

Referring to FIG. 60, using the remaining chromium film 6b and gate electrode 6a as a mask, boron is implanted with a dosage of $1 \times 10^{15}$ atoms/cm$^2$ and acceleration energy of 60 KeV, for example, to form impurity regions 4ad and 4ae identified as the source region and the drain region of the p type thin film transistor at impurity region 4aa located at region R3. At this stage, boron is not implanted into regions R1 and R2 since they are covered with chromium film 6b.

Then, predetermined photolithography is applied to form resist patterns 64a and 64b directed to patterning a gate electrode at regions R1 and R2, respectively. Further, resist pattern 64c covering region R3 is formed at region R3 (refer to FIG. 61). Here, resist pattern 64a at region R1 is formed so as to overlap in plane in with impurity regions 4ab and 4ac. The overlapping portion in plane of resist patterns 64a and impurity regions 4ab and 4ac becomes the GOLD region.

Figure 61:
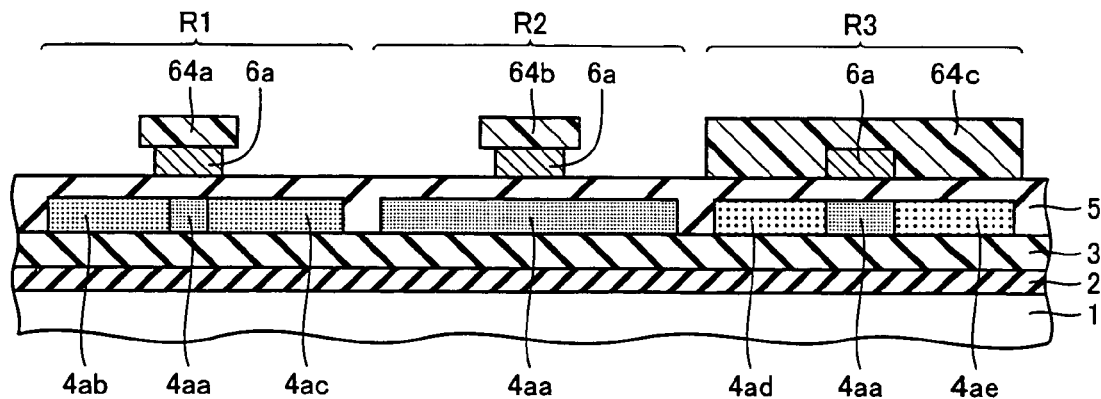
FIG. 61 is a sectional view of the semiconductor device of the fifth embodiment representing a step carried out after the step of FIG. 60.

Referring to FIG. 61, using resist patterns 64a, 64b, and 64c as a mask, chromium film 6b is subjected to etching to form gate electrode 6a at each of regions R1 and R2. Gate electrode 6a at region R1 is formed so as to overlap in plane with impurity regions 4ab and 4ac. Gate electrode 6a at region R3 is not subjected to etching since it is covered with resist pattern 64c. Then, ashing and chemical treatment are applied to remove resist patterns 64a, 64b and 64c.

Figure 62:
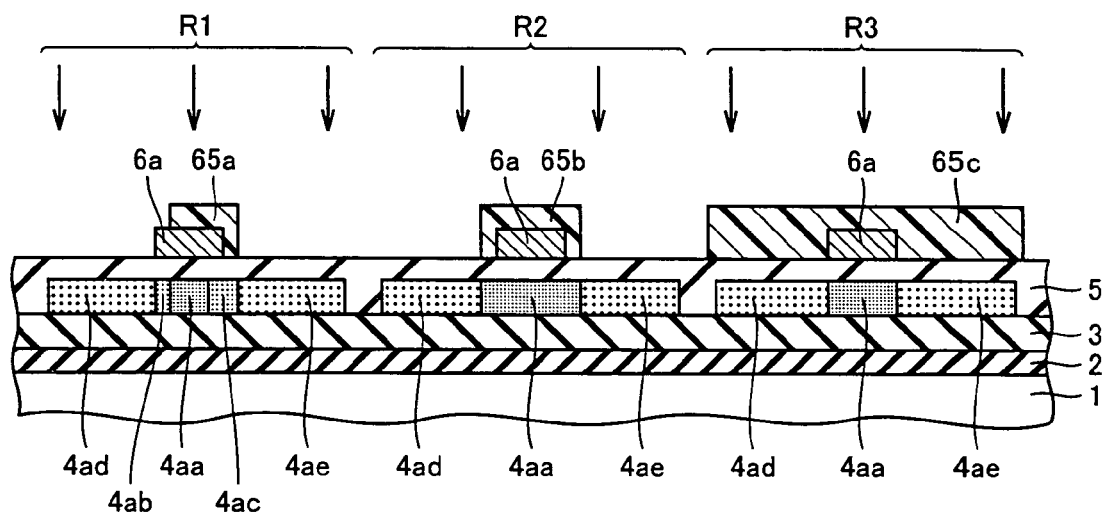
FIG. 62 is a sectional view of the semiconductor device of the fifth embodiment representing a step carried out after the step of FIG. 61.

Referring to FIG. 62, predetermined photolithography is applied to form resist patterns 65a and 65b required to form a source region and drain region at regions R1 and R2, respectively. At region R3, resist pattern 65c is formed thereon. Resist pattern 65a is formed so as to overlap with the portion of impurity region 4ac located at the drain side, and not overlap with the portion of impurity region 4ab located at the drain side. The overlapping region between resist pattern 65a and impurity region 4ac corresponds to the LDD region.

Resist pattern 65b is formed to overlap with the portion of impurity region 4aa located at the drain side, and overlap with the portion of impurity region 4aa located at the source side. The overlapping portion between resist pattern 65b and impurity region 4aa corresponds to the LDD region.

Using resist patterns 65a, 65b and 65c as a mask, phosphorus is implanted with a dosage of $1 \times 10^{14}$ atoms/cm$^2$ and acceleration energy of 80 KeV, for example, to form impurity region 4ad identified as the source region of the n channel thin film transistor of a GOLD structure and impurity region 4ae identified as the drain region at impurity regions 4ab and 4ac, respectively, at region R1.

At impurity region 4aa in region R2, impurity region 4ad and impurity region 4e identified as a source region and the drain region, respectively, of an n channel thin film transistor of an LDD structure are formed. Phosphorus is not implanted into region R3 since resist pattern 65c is applied thereon. Then, ashing and chemical treatment are applied to remove resist patterns 65a, 65b and 65c.

Figure 63:
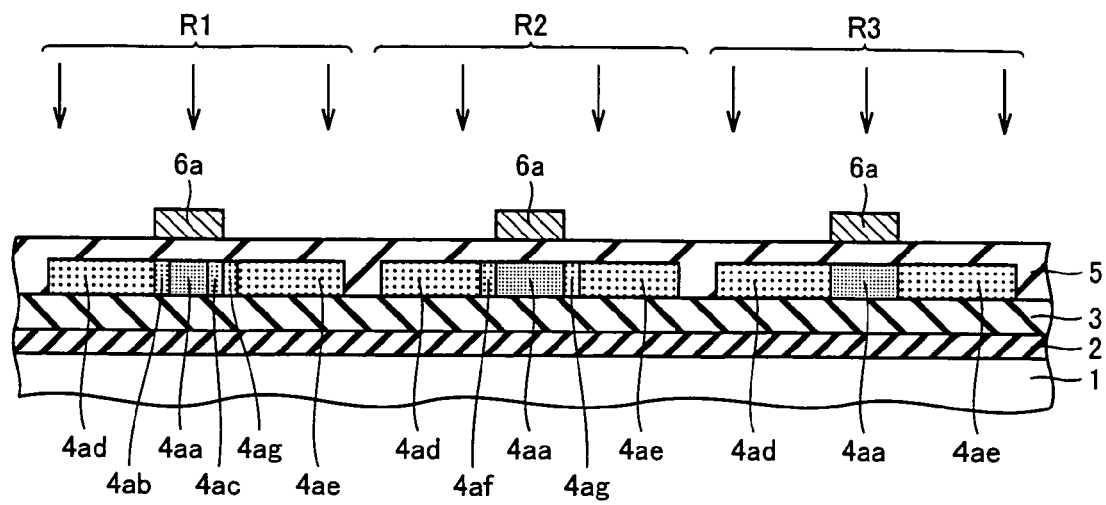
FIG. 63 is a sectional view of the semiconductor device of the fifth embodiment representing a step carried out after the step of FIG. 62.

Referring to FIG. 63, using gate electrode 6a as a mask, phosphorus is implanted with a dosage of $1 \times 10^{13}$ atoms/cm$^2$ and acceleration energy of 80 KeV, for example, to form impurity region 4ag at the area of impurity region 4ac remaining at region R1. Impurity region 4ag is identified as the LDD region at the drain side of an n channel thin film transistor of a GOLD structure. At this stage at region R1, phosphorus is not implanted into impurity region 4ab that is located at the source side of gate electrode 6a and overlapping with gate electrode 6a. Further, phosphorus is not implanted into the portion of impurity region 4ac located at the drain side of gate electrode 6a and overlapping with gate electrode 6a.

At this stage, although phosphorus is implanted into impurity regions 4ad and 4ae in which boron is implanted, corresponding to the source region and the drain region of the p channel thin film transistor at region R3, implantation of phosphorus into impurity regions 4ad and 4ae located at region R3 is of not concern since the implanted amount thereof is sufficiently lower than the implanted amount of boron.

Figure 64:
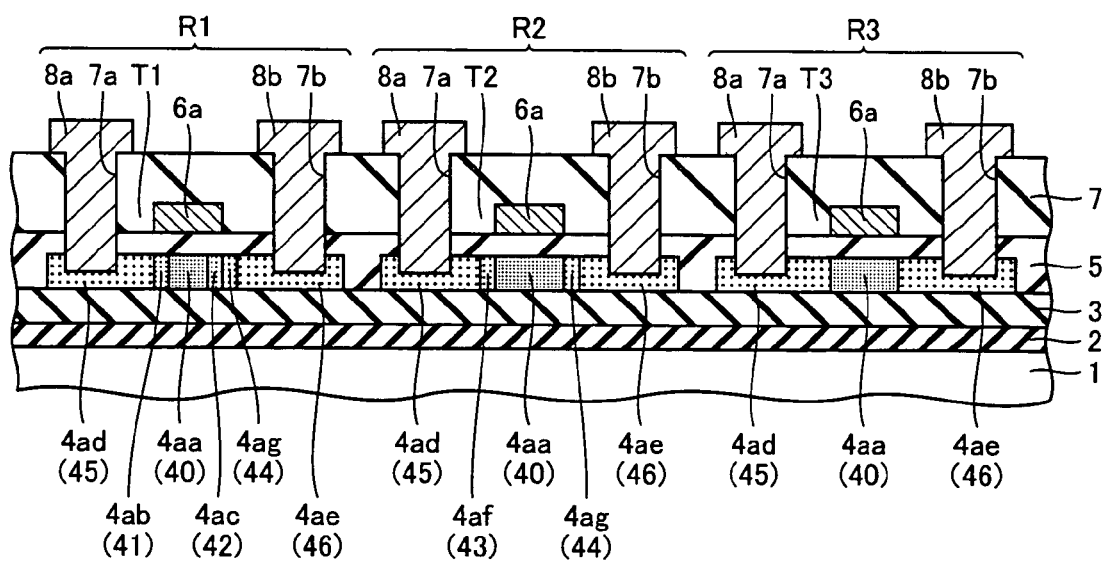
FIG. 64 is a sectional view of the semiconductor device of the fifth embodiment representing a step carried out after the step of FIG. 63.

Then, by a method similar to that described in the first embodiment, an interlayer insulation film 7 formed of a silicon oxide film is provided on glass substrate 1, as shown in FIG. 64. Then, predetermined photolithography is applied on interlayer insulation film 7 to form a resist pattern (not shown) directed to forming a contact hole. Using this resist pattern as a mask, interlayer insulation film 7 and gate insulation film 5 are subjected to anisotropic etching, whereby a contact hole 7a exposing the surface of impurity region 4ad in each of regions R1-R3 and a contact hole 7b exposing the surface of impurity region 4ae are formed.

Then, a multilayer film (not shown) of chromium film and aluminum film is formed on interlayer insulation film 7 so as to fill contact holes 7a and 7b. The multilayer film is subjected to predetermined photolithography to form a resist pattern (not shown) directed to formation of an electrode. Using this resist pattern as a mask, wet etching is applied to form a source electrode 8a and a drain electrode 8b at each of regions R1-R3.

Thus, an n channel thin film transistor T1 of a GOLD structure, an n channel thin film transistor T2 of an LDD structure, and a general p channel thin film transistor T3 are formed at regions R1, R2, and R3, respectively.

In n channel thin film transistor T1 of a GOLD structure, impurity regions 4ad and 4ae are identified as source region 45 and drain region 46, respectively. Impurity regions 4ab and 4ac are identified as GOLD regions 41 and 42, respectively. Impurity region 4ag is identified as LDD region 44.

In n channel thin film transistor T2 of an LDD structure, impurity regions 4ad and 4ae are identified as source region 45 and drain region 46, respectively. Impurity regions 4af and 4ag are identified as LDD regions 43 and 44, respectively.

At p channel thin film transistor T3, impurity region 4ad is identified as source region 45. Impurity region 4ae is identified as drain region 46.

Thus, an n channel thin film transistor T1 of a GOLD structure, an n channel thin film transistor T2 of an LDD structure, and a p channel thin film transistor T3 can be formed on the same glass substrate 1.

Although the above fabrication method was described in which a thin film transistor of a single drain structure is employed as a p channel thin film transistor, a p channel thin film transistor of an LDD structure may be formed. In this case, following formation of a gate electrode at the p channel thin film transistor, implantation directed to forming the source/drain regions is conducted without removing the resist pattern. Then, the resist pattern is removed to conduct implantation directed to formation of an LDD region. Thus, a p channel thin film transistor of an LDD structure can be obtained.

The above description is based on an example of a thin film transistor of a planar structure, i.e. a thin film transistor having a gate electrode formed on a semiconductor layer where source/drain regions and the like are formed with a gate insulation film therebetween.

The thin film transistor of a GOLD structure of the present invention is not limited to such a planar type thin film transistor. A reverse stagger type thin film transistor having a semiconductor layer corresponding to a source region and a drain region and the like formed on a gate electrode with a gate insulation film therebetween may be employed. In this case, the junction between the source region and the LDD region is located substantially on the same plane as one side of the electrode, and the junction between the GOLD region and the LDD region at the drain region is located substantially on the same plane as the other side of the electrode. Further, a semiconductor device of a double gate electrode structure having a gate electrode formed above and below the channel region may be employed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising a semiconductor element having a semiconductor layer, an insulation film, and an electrode formed on a predetermined substrate, wherein said semiconductor element comprises
   a first impurity region formed at said semiconductor layer,
   a second impurity region formed at said semiconductor layer with a distance from said first impurity region,
   a channel region functioning as a channel having a predetermined channel length, formed at a portion of said semiconductor layer between said first impurity region and said second impurity region,
   a third impurity region formed in contact with said channel region at a portion of said semiconductor layer between said second impurity region and said channel region, and
   a fourth impurity region formed at a portion of said semiconductor layer between said second impurity region and said third impurity region,
   wherein, in said semiconductor element,
   said electrode has one side and another side opposite to each other,
   said fourth impurity region is coupled with said second impurity region and said third impurity region,
   an end of said first impurity region at said channel region side is located substantially on a same plane as said one side, and a junction between said third impurity region and said fourth impurity region is located substantially on a same plane as said another side,
   said electrode is formed overlapping with and facing each of said channel region and said third impurity region entirely,
   said insulation film is formed between said semiconductor layer and said electrode so as to come into contact with each of said semiconductor layer and said electrode,
   an impurity concentration of each of said third and fourth impurity regions is set lower than the impurity concentration of each of said first impurity region and said second impurity region, and higher than the impurity concentration of said channel region,
   the impurity concentration of said third impurity region is set to be different from the impurity concentration of said fourth impurity region, and
   a junction where there is a change in the impurity concentration of the third impurity region from the impurity concentration of the fourth impurity region is formed between the third impurity region and the fourth impurity region, wherein respective impurity concentrations throughout the third and fourth impurity regions are substantially constant.

2. The semiconductor device according to claim 1, wherein a length of said fourth impurity region in a direction of a channel length at said semiconductor element is set not exceeding 2 μm.

3. The semiconductor device according to claim 1, wherein said substrate is one of a glass substrate and a quartz substrate.

4. The semiconductor device according to claim 1, wherein said semiconductor layer includes polycrystalline silicon.

5. A semiconductor device comprising a semiconductor element having a semiconductor layer, an insulation film, and an electrode formed on a predetermined substrate, wherein said semiconductor element comprises
   a first impurity region formed at said semiconductor layer,
   a second impurity region formed at said semiconductor layer with a distance from said first impurity region,
   a channel region functioning as a channel having a predetermined channel length, formed at a portion of said semiconductor layer between said first impurity region and said second impurity region with respective distances from said first impurity region and said second impurity region,
   a third impurity region formed in contact with said channel region at a portion of said semiconductor layer between said second impurity region and said channel region, and
   a fourth impurity region formed at a portion of said semiconductor layer between said second impurity region and said third impurity region, and
   a fifth impurity region formed at a portion of said semiconductor layer between said first impurity region and said channel region,
   wherein, in said semiconductor element,
   said electrode has one side and another side opposite to each other,
   said fourth impurity region is coupled with said second impurity region and said third impurity region,
   said fifth impurity region is coupled with said first impurity region,
   an end of said fifth impurity region at said channel region side is located substantially on a same plane as said one side, and a junction between said third impurity region and said fourth impurity region is located substantially on a same plane as said another side,
   said electrode is formed overlapping with and facing each of said channel region and said third impurity region entirely,
   said insulation film is formed between said semiconductor layer and said electrode so as to come into contact with each of said semiconductor layer and said electrode,
   an impurity concentration of each of said third to fifth impurity regions is set lower than the impurity concentration of each of said first impurity region and said second impurity region, and higher than the impurity concentration of said channel region,
   the impurity concentration of said third impurity region is set to be different from the impurity concentration of each of said fourth impurity region and said fifth impurity region,
   a junction where there is a an change in the impurity concentration of the third impurity region from the impurity concentration of the fourth impurity region is formed between the third impurity region and the fourth impurity region, wherein respective impurity concentrations throughout the third and fourth impurity regions are substantially constant, and
   a length of said fifth impurity region in a direction of a channel length is set shorter than the length of said fourth impurity region in the direction of the channel length.

6. The semiconductor device according to claim 5, wherein said length of said fourth impurity region in the direction of the channel length at said semiconductor element is set not exceeding 2 μm.

7. The semiconductor device according to claim 5, wherein said length of said fifth impurity region in the direction of the channel length at said semiconductor element is set not exceeding 0.5 μm.

8. The semiconductor device according to claim 5, wherein said substrate is one of a glass substrate and a quartz substrate.

9. The semiconductor device according to claim 5, wherein said semiconductor layer includes polycrystalline silicon.

10. An image display apparatus comprising an image display circuit unit to display an image,
    said image display circuit unit including a semiconductor element having a semiconductor layer, an insulation film, and an electrode formed on a predetermined substrate, wherein said semiconductor element comprises at least one of a first element and a second element,
said first element including
a first impurity region formed at said semiconductor layer,
a second impurity region formed at said semiconductor layer with a distance from said first impurity region,
a channel region functioning as a channel having a predetermined channel length, formed at a portion of said semiconductor layer between said first impurity region and said second impurity region,
a third impurity region formed in contact with said channel region at a portion of said semiconductor layer between said second impurity region and said channel region, and
a fourth impurity region formed at a portion of said semiconductor layer between said second impurity region and said third impurity region,
wherein, in said first element,
said electrode has one side and another side opposite to each other,
said fourth impurity region is coupled with said second impurity region and said third impurity region,
an end of said first impurity region at said channel region side is located substantially on a same plane as said one side, and a junction between said third impurity region and said fourth impurity region is located substantially on a same plane as said another side,
said electrode is formed overlapping with and facing each of said channel region and said third impurity region entirely,
said insulation film is formed between said semiconductor layer and said electrode so as to come into contact with each of said semiconductor layer and said electrode,
an impurity concentration of each of said third and fourth impurity regions is set lower than the impurity concentration of each of said first impurity region and said second impurity region, and higher than the impurity concentration of said channel region,
the impurity concentration of said third impurity region is set to be different from the impurity concentration of said fourth impurity region, and
a junction where there is a change in the impurity concentration of the third impurity region from the impurity concentration of the fourth impurity region is formed between the third impurity region and the fourth impurity region, wherein respective impurity concentrations throughout the third and fourth impurity regions are substantially constant,
said second element including
a fifth impurity region formed at said semiconductor layer,
a sixth impurity region formed at said semiconductor layer with a distance from said fifth impurity region,
a channel region functioning as a channel having a predetermined channel length, formed at a portion of said semiconductor layer between said fifth impurity region and said sixth impurity region with respective distances from said fifth impurity region and said sixth impurity region,
a seventh impurity region formed in contact with said channel region at a portion of said semiconductor layer between said sixth impurity region and said channel region,
an eighth impurity region formed at a portion of said semiconductor layer between said sixth impurity region and said seventh impurity region,
a ninth impurity region formed at a portion of said semiconductor layer between said fifth impurity region and said channel region,
wherein, in said second element,
said electrode has one side and another side opposite to each other,
said eighth impurity region is coupled with said sixth impurity region and said seventh impurity region,
said ninth impurity region is coupled with said fifth impurity region,
an end of said ninth impurity region at said channel region side is located substantially on a same plane as said one side, and a junction between said seventh impurity region and said eighth impurity region is located substantially on the same plane as said another side,
said electrode is formed overlapping with and facing each of said channel region and said seventh impurity region entirely,
said insulation film is formed between said semiconductor layer and said electrode so as to come in contact with said semiconductor layer and said electrode, respectively,
the impurity concentration of each of said seventh to ninth impurity regions is set lower than the impurity concentration of each of said fifth impurity region and said sixth impurity region, and higher than the impurity concentration of said channel region,
the impurity concentration of said seventh impurity region is set to be different from the impurity concentration of each of said eighth impurity region and said ninth impurity region, and
a length of said ninth impurity region in the direction of the channel length is set shorter than the length of said eighth impurity region in the direction of the channel length.

11. The image display apparatus including an image display circuit unit according to claim 10, wherein said semiconductor element further includes a predetermined third element,
wherein said third element comprises
a tenth impurity region formed at said semiconductor layer,
an eleventh impurity region formed at said semiconductor layer with a distance from said tenth impurity region,
a channel region functioning as a channel having a predetermined length, formed at a portion of said semiconductor layer between said tenth impurity region and said eleventh impurity region with respective distances from said tenth impurity region and said eleventh impurity region,
a twelfth impurity region formed in contact with each of said channel region and said tenth impurity region at a portion of said semiconductor layer between said tenth impurity region and said channel region,
a thirteenth impurity region formed in contact with each of said channel region and said eleventh impurity region at a portion of said semiconductor layer between said eleventh impurity region and said channel region,
wherein, in said third element,
said electrode has one side and another side opposite to each other,
a junction between said channel region and said twelfth impurity region is located substantially on a same plane as said one side, and a junction between said channel region and said thirteenth impurity region is located substantially on the same plane as said another side,
said electrode is formed overlapping with and facing said channel region entirely,
said insulation film is formed between said semiconductor layer and said electrode so as to come into contact with each of said semiconductor layer and said electrode, and the impurity concentration of each of said twelfth impurity region and said thirteenth impurity region is set lower than the impurity concentration of each of said tenth impurity region and said eleventh impurity region, and set higher than the impurity concentration of said channel region.

12. The image display apparatus including an image display circuit unit according to claim 10, wherein said semiconductor element includes at least one of said first element and said second element,
when said first and second elements are n channel type transistors, a voltage applied to said second impurity region is set higher than the voltage applied to said first impurity region, and the voltage applied to said sixth impurity region is set higher than the voltage applied to said fifth impurity region,
when said first and second elements are p channel transistors, the voltage applied to said second impurity region is set lower than the voltage applied to said first impurity region, and the voltage applied to said sixth impurity region is set lower than the voltage applied to said fifth impurity region.

13. The image display apparatus including an image display circuit unit according to claim 12, wherein said image display circuit unit includes an inverter circuit, and
at least one of said first and second elements is employed as an n channel transistor of said inverter circuit,
said second impurity region and said sixth impurity region are connected at an output side of said inverter circuit, and
said first impurity region and said fifth impurity region are connected to a ground potential or a predetermined potential.

14. The image display apparatus including an image display circuit unit according to claim 12, wherein said image display circuit unit includes an amplifier circuit, and
at least one of said first and second elements is employed as an n channel transistor of said amplifier circuit,
said second impurity region and said sixth impurity region are connected to a first potential, and
said first impurity region and said fifth impurity region are connected to a second potential lower than said first potential.

15. The image display apparatus including an image display circuit unit according to claim 12, wherein said image display circuit unit includes an organic EL pixel circuit, and
at least one of said first and second elements is employed as a transistor connected in series with an organic EL element, among transistors constituting said pixel circuit,
an image signal is applied to said first and fifth impurity regions, and
said second impurity region and said sixth impurity region are connected at a side of said organic EL element.

16. The image display apparatus including an image display circuit unit according to claim 10, wherein said semiconductor element includes at least one of said first element and said second element,
a predetermined capacitance is connected to said second impurity region and said sixth impurity region,
a predetermined signal voltage is applied to said first impurity region and said fifth impurity region, and
writing and retaining said signal voltage in said capacitance are conducted by switching said first and second elements.

17. The image display apparatus including an image display circuit unit according to claim 16, wherein said image display circuit unit includes a predetermined pixel circuit to display an image through liquid crystal,
said semiconductor element is employed as a transistor connected to a pixel electrode, among transistors constituting said pixel circuit, and
an image signal is applied to said first impurity region and said fifth impurity region, and said second impurity region and said sixth impurity region are arranged to be connected to a pixel electrode.

18. The image display apparatus including an image display circuit unit according to claim 16, wherein said image display circuit unit includes a pixel circuit displaying an image in liquid crystal, and including a predetermined data driver circuit,
said semiconductor element is employed as a transistor connected to a pixel electrode, among transistors constituting said data driver circuit,
an image signal is applied to said first impurity region and said fifth impurity region, and said second impurity region and said sixth impurity region are arranged to be connected to a data line.

19. The image display apparatus including an image display circuit unit according to claim 16, wherein said image display circuit unit includes a predetermined organic EL pixel circuit to display an image by organic EL,
said semiconductor element is employed as a transistor connected in series with a storage capacitance, among transistors constituting said organic EL pixel circuit,
an image signal is applied to said first impurity region and said fifth impurity region, and said second impurity region and said sixth impurity region are arranged to be connected to the storage capacitance.

20. The image display apparatus including an image display circuit unit according to claim 10, wherein said substrate is one of a glass substrate and a quartz substrate.

21. The image display apparatus including an image display circuit unit according to claim 10, wherein said semiconductor layer includes polycrystalline silicon.

22. The semiconductor device of claim 1, wherein the electrode is formed of a single layer.

23. The semiconductor device of claim 5, wherein the electrode is formed of a single layer.

24. The image display device of claim 10, wherein the electrode is formed of a single layer.

25. The semiconductor device according to claim 1, wherein
the junction where there is the change in the impurity concentration of the third impurity region from the impurity concentration of the fourth impurity region is oriented substantially perpendicular to a direction of the channel length.

26. The semiconductor device according to claim 1, wherein
the change in the impurity concentration of the third impurity region from the impurity concentration of the fourth impurity region comprises of at least a factor of 10 change in impurity concentration across the junction.

27. The semiconductor device according to claim 5, wherein
the junction where there is the change in the impurity concentration of the third impurity region from the impurity concentration of the fourth impurity region is oriented substantially perpendicular to a direction of the channel length.

28. The semiconductor device according to claim 5, wherein the change in the impurity concentration of the third impurity region from the impurity concentration of the fourth impurity region comprises of at least a factor of 10 change in impurity concentration across the junction.

29. The semiconductor device according to claim 10, wherein
the junction where there is the change in the impurity concentration of the third impurity region from the impurity concentration of the fourth impurity region is oriented substantially perpendicular to a direction of the channel length.

30. The semiconductor device according to claim 10, wherein the change in the impurity concentration of the third impurity region from the impurity concentration of the fourth impurity region comprises of at least a factor of 10 change in impurity concentration across the junction.

* * * * *